(12) United States Patent
Makino

(10) Patent No.: US 6,242,948 B1
(45) Date of Patent: *Jun. 5, 2001

(54) SEMICONDUCTOR INTEGRATED CIRCUIT DEVICE

(75) Inventor: Hiroshi Makino, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/048,975

(22) Filed: Mar. 27, 1998

(30) Foreign Application Priority Data

Nov. 19, 1997 (JP) .................................... 9-318737

(51) Int. Cl.[7] .............................................. H03K 19/0175
(52) U.S. Cl. .............................. 326/81; 327/530; 365/227
(58) Field of Search ................................ 326/17, 68, 80, 326/81, 83, 86, 112, 119, 121, 31, 34; 327/530; 365/226, 227

(56) References Cited

U.S. PATENT DOCUMENTS

| 4,859,870 | * | 8/1989 | Wong et al. ........................ 307/263 |
| 5,583,475 | * | 12/1996 | Horiguchi et al. .................. 326/121 |
| 5,650,742 | * | 7/1997 | Hirano ............................... 327/333 |
| 5,726,562 |   | 3/1998 | Mizuno . |

FOREIGN PATENT DOCUMENTS

| 6-29834 | 2/1994 | (JP) . |
| 7-212217 | 8/1995 | (JP) . |
| 7-212218 | 8/1995 | (JP) . |
| 7-296587 | 10/1995 | (JP) . |
| 9-73784 | 3/1997 | (JP) . |

* cited by examiner

*Primary Examiner*—Michael Tokar
*Assistant Examiner*—Daniel D. Chang
(74) *Attorney, Agent, or Firm*—Burns, Doane, Swecker & Mathis, LLP

(57) ABSTRACT

A semiconductor integrated circuit device comprises a first switching element, such as a p-channel MOSFET, capable of connecting said first power supply with a first power supply line, a second switching element, such as an n-channel MOSFET, capable of connecting said second power supply with a second power supply line, a first voltage drop circuit connected between said first power supply and said first power supply line, a second voltage drop circuit connected between said second power supply and said second power supply line, and a sequential circuit connected between said first and second power supply lines and comprised of p-channel MOSFETs and n-channel MOSFETs, substrate terminals of the p-channel MOSFETs being connected to said first power supply and substrate terminals of the n-channel MOSFETs being connected to said second power supply.

20 Claims, 13 Drawing Sheets

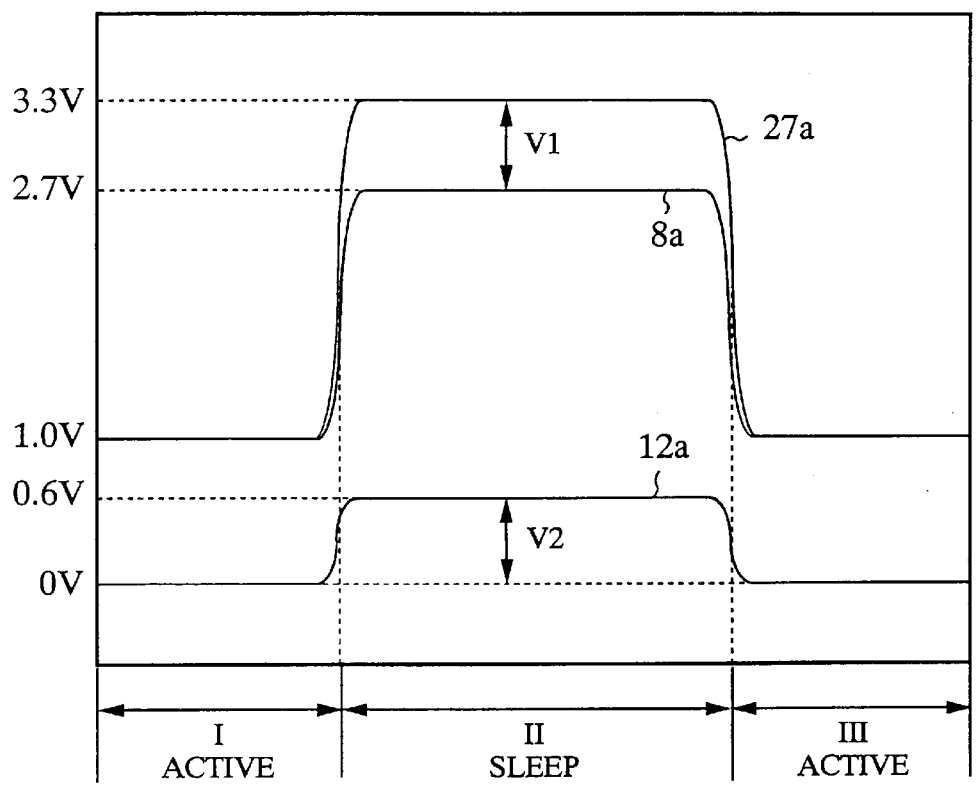
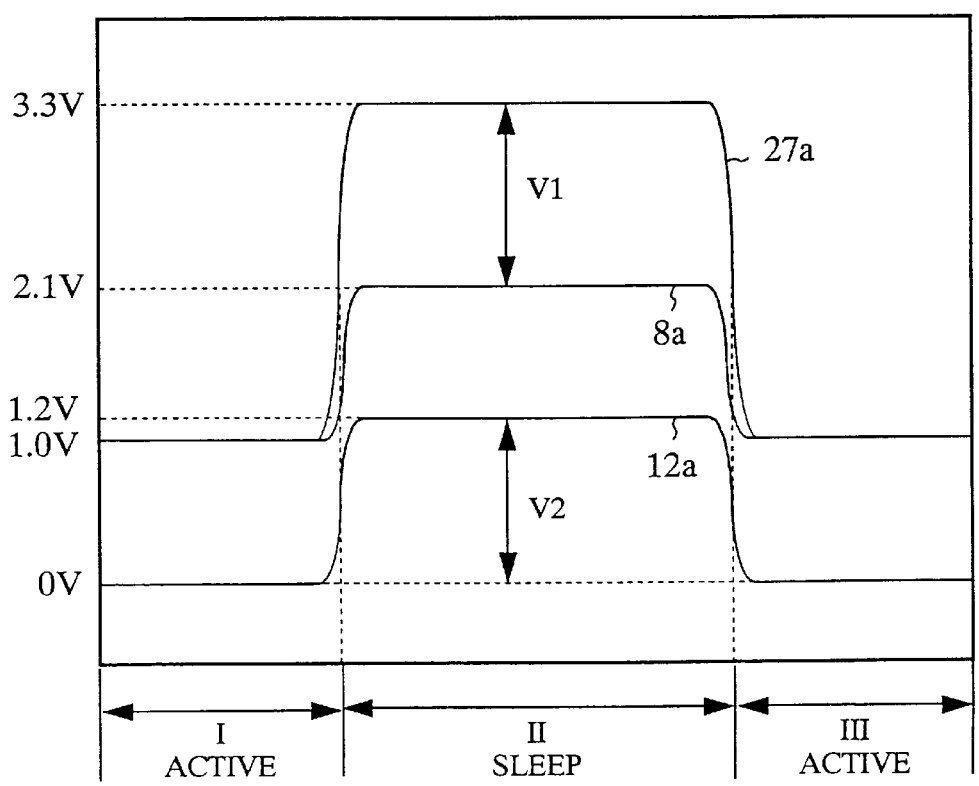

SEMICONDUCTOR INTEGRATED CIRCUIT DEVICE

BACKGROUND OF THE INVENTION

1. Field of the Invention

The present invention relates to a semiconductor integrated circuit device intended to reduce its power consumption.

2. Description of the Prior Art

Recent developments in portable or mobile equipment have caused requirements of low power semiconductor integrated circuit devices, which can be built in mobile equipment, for long battery life. Reduction in the operating voltage of a semiconductor integrated circuit device is one of effective methods of reducing the power consumption. Since the power consumption is the product of the current and the voltage, both the voltage and the current can be reduced along with the reduction in the operation voltage. It is therefore said that in general, reduction in the operating voltage of a semiconductor integrated circuit device can produce a squared effect with respect to the reduction in the power consumption.

On the other hand, a MOSFET which constructs a semiconductor integrated circuit device has the property that, as the power voltage applied thereto is reduced, its performance is reduced and hence its response speed is reduced. To avoid the reduction in the performance of a MOSFET, it is necessary to reduce the threshold voltage according to the reduction in the power voltage. However, the threshold voltage cannot be reduced in proportion to the reduction in the power voltage, in practice. This is because the reduction in the threshold voltage causes an increase in the amount of a leak current flowing in a MOSFET when the MOSFET is held in its off state and hence an increase in the power consumption.

To overcome the above problem, a prior art method as disclosed in Japanese Patent Application Laying Open (KOKAI) No. 7-212218 has been used. Referring next to FIG. 15, there is illustrated a schematic circuit diagram of a prior art semiconductor integrated circuit device which can run from low voltage supply. The device is constructed from a multi-threshold CMOS or MT-CMOS. In the figure, reference numeral 1 denotes a two-input NAND gate, 2 and 3 denote p-channel MOSFETs, 4 and 5 denote n-channel MOSFETs, 6 denotes a p-channel MOSFET which can be turned on in response to a control signal 9 asserted LOW so as to connect a power supply 7 with a power supply line 8 (VA1), and 10 denotes an n-channel MOSFET which can be turned on in response to a control signal 13 asserted HIGH so as to connect a ground potential node or GND 11 with a power supply line 12 (VB1). The absolute values of the threshold voltages of the p-channel MOSFET 6 and the n-channel MOSFET 10 are set to be greater than those of the threshold voltages of the p-channel MOSFETs 2 and 3 and the n-channel MOSFETs 4 and 5 which construct the two-input NAND gate 1.

Each of the p-channel MOSFETs 2 and 3 has a substrate terminal connected to the VA1 8, and each of the n-channel MOSFETs 4 and 5 has a substrate terminal connected to the VB1 12. The p-channel MOSFET 6 has a substrate terminal connected to the power supply 7, and the n-channel MOSFET 10 has a substrate terminal connected to the GND 11.

When activating the two-input NAND gate 1 as shown in FIG. 15, the control signal 9 is caused to make a HIGH to LOW transition and the control signal 13 which is the inversion of the control signal 9 is therefore caused to make a LOW to HIGH transition. Both the p-channel MOSFET 6 and the n-channel MOSFET 10 are then turned on, and therefore the potential of the VA1 8 rises to the potential of the power supply 7 and the potential of the VB1 12 descends to the level of the GND 11. As a result, the two-input NAND gate 1 can operate as a normal NAND circuit. In this case, since the absolute values of the threshold voltages of the MOSFETs 2 through 5 are set to be relatively small, the NAND gate 1 runs at a high speed even though the voltage from the power supply 7 is low.

When deactivating the two-input NAND gate 1, the control signal 9 is caused to make a LOW to HIGH transition and the control signal 13 which is the inversion of the control signal 9 is therefore caused to make a HIGH to LOW transition. Both the p-channel MOSFET 6 and the n-channel MOSFET 10 are then turned off and therefore the VA1 8 and the VB1 12 are disconnected from the power supply 7 and the GND 11, respectively. Since the absolute values of the threshold voltages of the p-channel MOSFET 6 and the n-channel MOSFET 10 are set to be greater than those of the threshold voltages of the p-channel MOSFETs 2 and 3 and the n-channel MOSFETs 4 and 5, the amounts of leak currents flowing through the MOSFETs in the two-input NAND gate 1 can be controlled to small ones.

In general, when the voltage between the gate and the source of a MOSFET is less than or equal to its threshold voltage, the leak current that flows between the source and the gate of the MOSFET increases exponentially with an increase in the gate voltage. Therefore, making a difference between the threshold voltages of the MOSFETs 2 through 5 and those of the MOSFETs 6 and 10 can reduce the leak currents flowing through the two-input NAND gate 1 not in active use by a large amount. A similar explanation can be made for any other type of internal circuitry having any size such as a logic circuit or a storage circuit, included in a semiconductor integrated circuit device, other than the two-input NAND gate 1 shown as an example of the internal circuitry.

A problem with such a prior art semiconductor integrated circuit device which can run from low voltage supply is that when the internal circuitry included in the semiconductor integrated circuit device is a combinational circuit in which its output is determined by a combination of inputs, such as a two-input NAND gate as mentioned above, the internal circuitry works properly, but,. when the internal circuitry is a sequential circuit such as a latch circuit in which its output depends on previous input conditions, there is a possibility that the internal circuitry fails to work properly, as will be explained below.

Referring next to FIG. 16, there is illustrated a schematic circuit diagram showing another prior art semiconductor integrated circuit device including internal circuitry which serves as a sequential circuit. The semiconductor integrated circuit device is so-called a latch circuit in which the inputs and outputs of two inverters are connected to each other while the connections cross each other. In the figure, reference numeral 20 denotes a latch circuit, 21 and 22 denote p-channel MOSFETs, and 23 and 24 denote n-channel MOSFETs. The other structure of the semiconductor integrated circuit device is the same as that of the semiconductor integrated circuit device shown in FIG. 15. The absolute values of the threshold voltages of the p-channel MOSFET 6 and the n-channel MOSFET 10 are set to be greater than those of the p-channel MOSFETs 21 and 22 and the n-channel MOSFETs 23 and 24 which construct the latch circuit 20.

As shown in FIG. 16, the latch circuit 20 is constructed of the p-channel MOSFETs 21 and 22 and the n-channel MOSFETs 23 and 24 having their threshold voltages which are relatively small. A node 25 and a node 26 pair up with each other. When one of the pair of nodes 25 and 26 is held in a HIGH logic level, the other one of the pair is held in a LOW logic level.

When a control signal 9 asserted LOW and a control signal 13 asserted HIGH are applied to the p-channel MOSFET 6 and the n-channel MOSFET 10, respectively, the latch circuit 20 is activated. Then the nodes 25 and 26 can hold values normally. Data can be written into or read out of 25 the nodes 25 and 26 at a high speed because the absolute values of the threshold voltages of the p-channel MOSFETs 21 and 22 and the n-channel MOSFETs 23 and 24 are relatively small. However, if an attempt is made to reduce leakage currents flowing through the MOSFETs when the latch circuit 20 is deactivated in response to the control signal 9 at a HIGH logic level and the control signal 13 at a LOW logic level, data cannot be held at the nodes 25 and 26 because leakage currents flowing through the p-channel MOSFETs 21 and 22 and the n-channel MOSFETs 23 and 24 when the latch circuit 20 is deactivated become greater than those flowing through the p-channel MOSFET 6 and the n-channel MOSFET 10 when the latch circuit 20 is deactivated. For example, in a case where the node 25 has a HIGH logic level and the node 26 has a LOW logic level, the p-channel MOSFET 22 and the n-channel MOSFET 23 are turned off and the p-channel MOSFET 21 and the n-channel MOSFET 24 are turned on, then the potential of the node 25 at a HIGH logic level descends and the potential of the node 26 at a LOW logic level rises because of leakage currents flowing Ls through the p-channel MOSFET 22 and the n-channel MOSFET 23 until they are equal to each other, and finally the data held at the nodes 25 and 26 are erased.

As previously mentioned, a problem with such a prior art semiconductor integrated circuit device is that when a latch circuit is disposed as an internal circuit of the semiconductor integrated circuit device, data held at nodes within the latch circuit are erased because of leakage currents flowing through MOSFETs which construct the latch circuit.

SUMMARY OF THE INVENTION

The present invention is made to overcome the above problem. It is therefore an object of the present invention to provide a semiconductor integrated circuit device capable of reducing leakage currents flowing through MOSFETs included in a sequential circuit which can be disposed as an internal circuit within the semiconductor integrated circuit device, and enabling the sequential circuit to keep holding data therein.

In accordance with one aspect of the present invention, there is provided a semiconductor integrated circuit device comprising: a first power supply; a second power supply having a potential less than that of the first power supply; a first switching element capable of connecting the first power supply with a first power supply line; a second switching element capable of connecting the second power supply with a second power supply line; a first voltage drop circuit connected between the first power supply and the first power supply line; a second voltage drop circuit connected between the second power supply and the second power supply line; and a sequential circuit connected between the first power supply line and the second power supply line, and comprised of a plurality of p-channel MOSFETs and a plurality of n-channel MOSFETs, each of the plurality of p-channel MOSFETs having a substrate terminal connected to the first power supply and each of the plurality of n-channel MOSFETs having a substrate terminal connected to the second power supply.

In accordance with a preferred embodiment, the first switching is comprised of a p-channel MOSFET with a threshold voltage having a absolute value which is greater than those of the threshold voltages of the plurality of p-channel MOSFETs included in the sequential circuit, and the second switching is comprised of an n-channel MOSFET with a threshold voltage having a absolute value which is greater than those of the threshold voltages of the plurality of n-channel MOSFETs included in the sequential circuit.

The first power supply can have a first potential when activating the sequential circuit, and have a second potential having a value greater than that of the first potential when deactivating or bringing the sequential circuit into sleep. Preferably, the semiconductor integrated circuit device further comprises a voltage converter for generating the first and second potentials of the first power supply from a power source.

In accordance with another preferred embodiment, each of the first and second voltage drop circuits is comprised of one or more diodes connected in series to each other. Alternatively, each of the first and second voltage drop circuits can be comprised of one or more MOSFETs connected in series to each other and each having a gate and a drain connected in common to each other.

In accordance with another preferred embodiment, the semiconductor integrated circuit device further comprises a level determining circuit for determining whether an input signal from the sequential circuit has a HIGH logic level or a LOW logic level, and a level converting unit for converting the input signal into a signal having a predetermined high potential when the level determining circuit has determined that the input signal has a HIGH logic level, and for converting the input signal into a signal having a predetermined low potential when the level determining circuit has determined that the input signal has a LOW logic level.

Preferably, the semiconductor integrated circuit device further comprises a third power supply having a potential greater than that of the second power supply. Furthermore, the level determining circuit can include a first inverter for inverting an input signal from the sequential circuit and for furnishing the inverted signal, and a second inverter for inverting the inverted signal from the first inverter and for furnishing a signal which is the inversion of the inverted signal. The level converting unit can include a first level converting circuit for generating a first signal having the same potential as the third power supply and a second signal having the same potential as the second power supply line in response to the inverted signal from the first inverter and the signal from the second inverter which is the inversion of the inverted signal, and a second level converting circuit for generating a first output signal having the same potential as the third power supply and a second output signal having the same potential as the second power supply in response to the first and second signals from the first level converting circuit, so that the level converting unit converts an input signal at a HIGH logic level from the sequential circuit into a signal having the same potential as the third power supply and converts an input signal at a LOW logic level from the sequential circuit into a signal having the same potential as the second power supply.

Each of the first and second inverters can include a pair of a p-channel MOSFET and an n-channel MOSFET connected in series to each other and connected between the first power supply line and the second power supply line, the p-channel MOSFET having a substrate terminal connected to the first power supply and the n-channel MOSFET having a substrate terminal connected to the second power supply. The first level converting circuit can include two pairs of a p-channel MOSFET and an n-channel MOSFET connected in series to each other and connected between the third power supply and the second power supply line, the absolute values of threshold voltages of the p-channel MOSFETs of the first level converting circuit being greater than those of threshold voltages of the p-channel MOSFETs which construct the first and second inverters, each of the p-channel MOSFETs of the first level converting circuit having a substrate terminal connected to the third power supply and each of the n-channel MOSFETs of the first level converting circuit having a substrate terminal connected to the second power supply. The second level converting circuit can include two pairs of a p-channel MOSFET and an n-channel MOSFET connected in series to each other and connected between the third power supply and the second power supply, the absolute values of threshold voltages of the p-channel MOSFETs of the second level converting circuit being greater than those of threshold voltages of the p-channel MOSFETs which construct the first and second inverters, the absolute values of threshold voltages of the n-channel MOSFETs of the second level converting circuit being greater than those of threshold voltages of the n-channel MOSFETs which construct the first and second inverters, each of the p-channel MOSFETs of the second level converting circuit having a substrate terminal connected to the third power supply and each of the n-channel MOSFETs of the second level converting circuit having a substrate terminal connected to the second power supply.

In accordance with another preferred embodiment, the semiconductor integrated circuit device further comprises a third power supply having a potential greater than that of the second power supply. Furthermore, the level determining circuit can include a first inverter for inverting an input signal from the sequential circuit and for furnishing the inverted signal, and a second inverter for inverting the inverted signal from the first inverter and for furnishing a signal which is the inversion of the inverted signal. The level converting unit can include a first level converting circuit for generating a first signal having the same potential as the first power supply and a second signal having the same potential as the second power supply in response to the inverted signal from the first inverter and the signal from the second inverter which is the inversion of the inverted signal, and a second level converting circuit for generating a first output signal having the same potential as the third power supply and a second output signal having the same potential as the second power supply in response to the first and second signals from the first level converting circuit, so that the level converting unit converts an output signal at a HIGH logic level from the sequential circuit into a signal having the same potential as the third power supply and converts an output signal at a LOW logic level from the sequential circuit into a signal having the same potential as the second power supply.

Each of the first and second inverters can include a pair of a p-channel MOSFET and an n-channel MOSFET connected in series to each other and connected between the first power supply line and the second power supply line, the p-channel MOSFET having a substrate terminal connected to the first power supply and the n-channel MOSFET having a substrate terminal connected to the second power supply. The first level converting circuit can include two pairs of a p-channel MOSFET and an n-channel MOSFET connected in series to each other and connected between the first power supply and the second power supply, the absolute values of threshold voltages of the n-channel MOSFETs of the first level converting circuit being greater than those of threshold voltages of the n-channel MOSFETs which construct the first and second inverters, each of the p-channel MOSFETs of the first level converting circuit having a substrate terminal connected to the first power supply and each of the n-channel MOSFETs of the first level converting circuit having a substrate terminal connected to the second power supply. The second level converting circuit can include two pairs of a p-channel MOSFET and an n-channel MOSFET connected in series to each other and connected between the third power supply and the second power supply, the absolute values of threshold voltages of the p-channel MOSFETs of the second level converting circuit being greater than those of threshold voltages of the p-channel MOSFETs which construct the first and second inverters, the absolute values of threshold voltages of the n-channel MOSFETs of the second level converting circuit being greater than those of threshold voltages of the n-channel MOSFETs which construct the first and second inverters, each of the p-channel MOSFETs of the second level converting circuit having a substrate terminal connected to the third power supply and each of the n-channel MOSFETs of the second level converting circuit having a substrate terminal connected to the second power supply.

In accordance with another aspect of the present invention, there is provided a semiconductor integrated circuit device comprising: a first power supply; a second power supply having a potential less than that of the first power supply; a third power supply having a potential greater than that of the first power supply; a first p-channel MOSFET capable of connecting the first power supply with a first power supply line; a second p-channel MOSFET capable of connecting the first power supply with a first node; a third p-channel MOSFET capable of connecting the first node with the third power supply; a first n-channel MOSFET capable of connecting the second power supply with a second power supply line; a first voltage drop circuit connected between the first node and the first power supply line; a second voltage drop circuit connected between the second power supply and the second power supply line; and a sequential circuit connected between the first power supply line and the second power supply line, and comprised of a plurality of p-channel MOSFETs and a plurality of n-channel MOSFETs, the absolute values of threshold voltages of the plurality of p-channel MOSFETs being less than those of threshold voltages of the first to third p-channel MOSFETs, the absolute values of threshold voltages of the plurality of n-channel MOSFETs being less than those of threshold voltages of the first n-channel MOSFET, each of the plurality of p-channel MOSFETs having a substrate terminal connected to the first node, and each of the plurality of n-channel MOSFETs having a substrate terminal connected to the second power supply.

Preferably, each of the first and second voltage drop circuits is comprised of one or more diodes connected in series to each other. Alternatively, each of the first and second voltage drop circuits is comprised of one or more MOSFETs connected in series to each other and each having a gate and a drain connected in common to each other.

In accordance with a preferred embodiment, the semiconductor integrated circuit device further comprises a voltage converter for either generating the first power supply from the third power supply or generating the third power supply from the first power supply.

In accordance with another preferred embodiment, the semiconductor integrated circuit device further comprises a level determining circuit for determining whether an input signal from the sequential circuit has a HIGH logic level or a LOW logic level, and a level converting unit for converting the input signal into a signal having a predetermined high potential when the level determining circuit has determined that the input signal has a HIGH logic level, and for converting the input signal into a signal having a predetermined low potential when the level determining circuit has determined that the input signal has a LOW logic level.

Preferably, the semiconductor integrated circuit device further comprises a fourth power supply having a potential greater than that of the second power supply. Furthermore, the level determining circuit can include a first inverter for inverting an input signal from the sequential circuit and for furnishing the inverted signal, and a second inverter for inverting the inverted signal from the first inverter and for furnishing a signal which is the inversion of the inverted signal. The level converting unit can include a first level converting circuit for generating a first signal having the same potential as the fourth power supply and a second signal having the same potential as the second power supply line in response to the inverted signal from the first inverter and the signal from the second inverter which is the inversion of the inverted signal, and a second level converting circuit for generating a first output signal having the same potential as the fourth power supply and a second output signal having the same potential as the second power supply in response to the first and second signals from the first level converting circuit, so that the level converting unit converts an output signal at a HIGH logic level from the sequential circuit into a signal having the same potential as the fourth power supply and converts an output signal at a LOW logic level from the sequential circuit into a signal having the same potential as the second power supply.

Each of the first and second inverters can include a pair of a p-channel MOSFET and an n-channel MOSFET connected in series to each other and connected between the first power supply line and the second power supply line, the p-channel MOSFET having a substrate terminal connected to the first power supply and the n-channel MOSFET having a substrate terminal connected to the second power supply. Furthermore, the first level converting circuit can include two pairs of a p-channel MOSFET and an n-channel MOSFET connected in series to each other and connected between the fourth power supply and the second power supply line, the absolute values of threshold voltages of the p-channel MOSFETs of the first level converting circuit being greater than those of threshold voltages of the p-channel MOSFETs which construct the first and second inverters, each of the p-channel MOSFETs of the first level converting circuit having a substrate terminal connected to the fourth power supply and each of the n-channel MOSFETs of the first level converting circuit having a substrate terminal connected to the second power supply. The second level converting circuit can include two pairs of a p-channel MOSFET and an n-channel MOSFET connected in series to each other and connected between the fourth power supply and the second power supply, the absolute values of threshold voltages of the p-channel MOSFETs of the second level converting circuit being greater than those of threshold voltages of the p-channel MOSFETs which construct the first and second inverters, the absolute values of threshold voltages of the n-channel MOSFETs of the second level converting circuit being greater than those of threshold voltages of the n-channel MOSFETs which construct the first and second inverters, each of the p-channel MOSFETs of the second level converting circuit having a substrate terminal connected to the fourth power supply and each of the n-channel MOSFETs of the second level converting circuit having a substrate terminal connected to the second power supply.

In accordance with another preferred embodiment, the semiconductor integrated circuit device further comprises a fourth power supply having a potential greater than that of the second power supply. Furthermore, the level determining circuit can include a first inverter for inverting an input signal from the sequential circuit and for furnishing the inverted signal, and a second inverter for inverting the inverted signal from the first inverter and for furnishing a signal which is the inversion of the inverted signal. The level converting unit can include a first level converting circuit for generating a first signal having the same potential as the first power supply and a second signal having the same potential as the second power supply in response to the inverted signal from the first inverter and the signal from the second inverter which is the inversion of the inverted signal, and a second level converting circuit for generating a first output signal having the same potential as the fourth power supply and a second output signal having the same potential as the second power supply in response to the first and second signals from the first level converting circuit, so that the level converting unit converts an input signal at a HIGH logic level from the sequential circuit into a signal having the same potential as the fourth power supply and converts an input signal at a LOW logic level from the sequential circuit into a signal having the same potential as the second power supply.

Each of the first and second inverters can include a pair of a p-channel MOSFET and an n-channel MOSFET connected in series to each other and connected between the first power supply line and the second power supply line, the p-channel MOSFET having a substrate terminal connected to the first power supply and the n-channel MOSFET having a substrate terminal connected to the second power supply. The first level converting circuit can include two pairs of a p-channel MOSFET and an n-channel MOSFET connected in series to each other and connected between the first power supply and the second power supply, the absolute values of threshold voltages of the n-channel MOSFETs of the first level converting circuit being greater than those of threshold voltages of the n-channel MOSFETs which construct the first and second inverters, each of the p-channel MOSFETs of the first level converting circuit having a substrate terminal connected to the first power supply and each of the n-channel MOSFETs of the first level converting circuit having a substrate terminal connected to the second power supply. The second level converting circuit can include two pairs of a p-channel MOSFET and an n-channel MOSFET connected in series to each other and connected between the fourth power supply and the second power supply, the absolute values of threshold voltages of the p-channel MOSFETs of the second level converting circuit being greater than those of threshold voltages of the p-channel MOSFETs which construct the first and second inverters, the absolute values of threshold voltages of the n-channel MOSFETs of the second level converting circuit being greater than those of threshold voltages of the n-channel MOSFETs which construct the first and second inverters, each of the p-channel MOSFETs of the second level converting circuit having a substrate terminal connected to the fourth power supply and each of the n-channel MOSFETs of the second level converting circuit having a substrate terminal connected to the second power supply.

Further objects and advantages of the present invention will be apparent from the following description of the preferred embodiments of the invention as illustrated in the accompanying drawings.

BRIEF DESCRIPTION OF THE DRAWINGS

FIG. 2 is a timing chart showing potentials at some important points of FIG. 1;

FIG. 4 is a timing chart showing potentials at some important points of the circuitry shown in FIG. 3;

DETAILED DESCRIPTION OF THE PREFERRED EMBODIMENTS

First Embodiment

Figure 1:
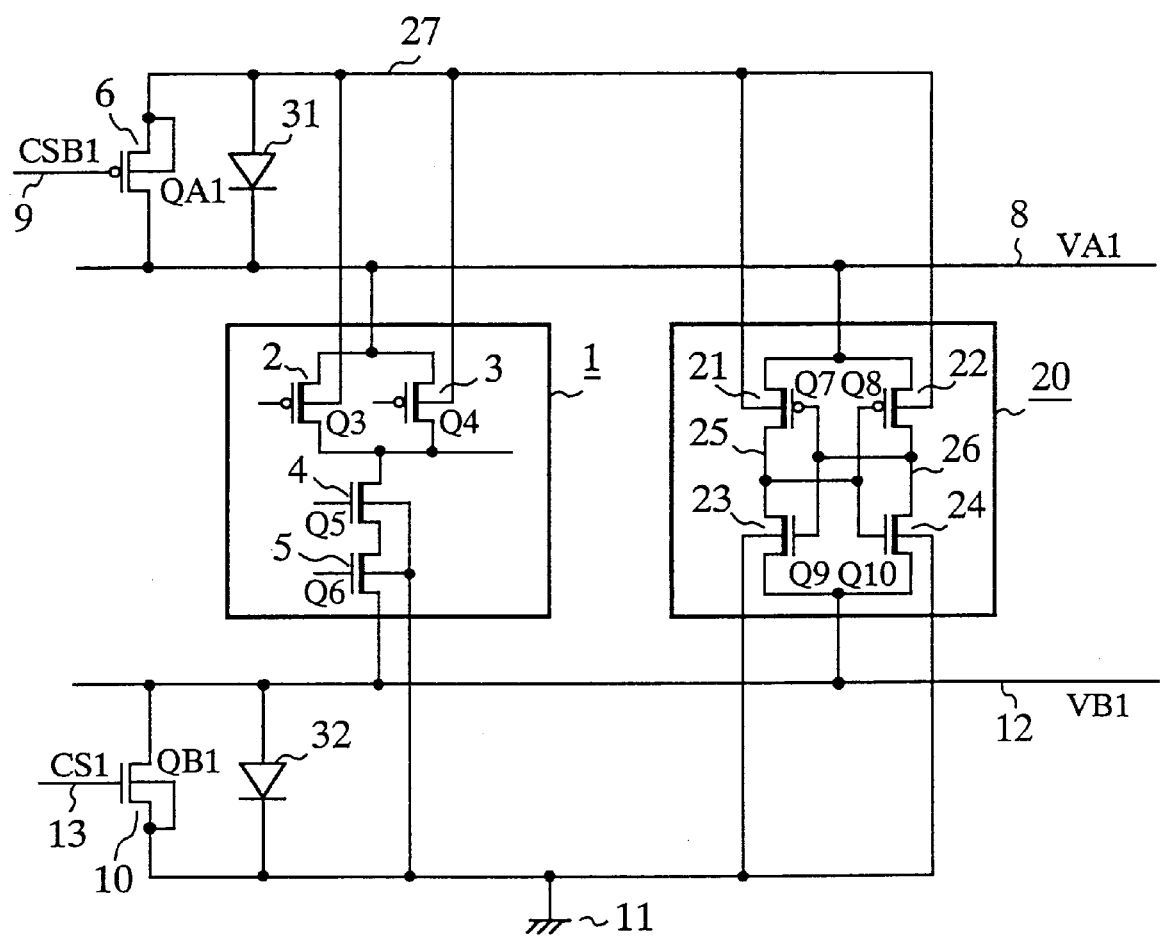
FIG. 1 is a schematic circuit diagram showing a semiconductor integrated circuit device according to a first embodiment of the present invention.

Referring next to FIG. 1, there is illustrated a schematic circuit diagram showing a semiconductor integrated circuit device according to a first embodiment of the present invention. In the figure, reference numeral 1 denotes a two-input NAND gate, 2 and 3 denote p-channel MOSFETs, and 4 and 5 denotes n-channel MOSFETs. Furthermore, 20 denotes a latch circuit (sequential circuit), 21 and 22 denote p-channel MOSFETs, and 23 and 24 denotes n-channel MOSFETs.

In addition, reference numeral 6 denotes a p-channel MOSFET disposed as a first switching element and connected between a first power supply 27 and a first power supply line 8, which will be referred to as VA1. The p-channel MOSFET 6 can be turned on in response to a control signal 9 applied thereto. Reference numeral 10 denotes an n-channel MOSFET disposed as a second switching element and connected between a ground potential node or second power supply 11, which will be referred to as GND, and a second power supply line (VB1) 12. The n-channel MOSFET 10 can be turned on in response to a control signal 13 applied thereto. The absolute values of the threshold voltages of the p-channel MOSFET 6 and the n-channel MOSFET 10 are set to be greater than those of the threshold voltages of the p-channel MOSFETs 2, 3, 21, and 22, and the n-channel MOSFETs 4, 5, 23, and 24, which construct the two-input NAND gate 1 and the latch circuit 20.

Reference numeral 31 denotes a diode disposed as a first voltage drop circuit, and having its anode connected to the first power supply 27 and its cathode connected to the VA1 8, and 32 denotes another diode disposed as a second voltage drop circuit, and having its anode connected to the VB1 12 and its cathode connected to the GND 11.

Each of the p-channel MOSFETs 2, 3, 6, 21, and 22 has a substrate terminal connected to the first power supply 27, and each of the n-channel MOSFETs 4, 5, 10, 23, and 24 has a substrate terminal connected to the GND 11 so as to have the same potential as the GND 11.

When activating the two-input NAND gate 1 and the latch circuit 20, the potential of the power supply 27 is set to a first potential having a low value, and the control signal 9 at a LOW logic level and the control signal 13 at a HIGH logic level, which can be the inversion of the control signal 9, are applied to the semiconductor integrated circuit device of this embodiment. Both the p-channel MOSFET 6 and the n-channel MOSFET 10 are then turned on, and therefore the potential of the VA1 8 rises to the potential of the power supply 27 and the potential of the VB1 12 descends to the ground potential of the GND 11. As a result, both the two-input NAND gate 1 and the latch circuit 20 start to operate properly. At that time, they operate at a high speed because the absolute values of the threshold voltages of the MOSFETs included in the two-input NAND gate 1 and the latch circuit 20 are set to be small compared with those of the threshold voltages of the p-channel MOSFET 6 and the n-channel MOSFET 10. While the two-input NAND gate 1 and the latch circuit 20 operate, both the diodes 31 and 32 are brought into an off state because the voltages between their anodes and cathodes are set to be 0 volts. Therefore, the diodes 31 and 32 have no effect on the operations of the two-input NAND gate 1 and the latch circuit 20.

When deactivating the two-input NAND gate 1 and the latch circuit 20, the control signal 9 is caused to make a LOW to HIGH transition and the control signal 13 which is the inversion of the control signal 9 is therefore caused to make a HIGH to LOW transition. Simultaneously, the potential of the power supply 27 is changed to a second potential having a high value greater than that of the first potential. Both the p-channel MOSFET 6 and the n-channel MOSFET 10 are then turned off, and both the VA1 8 and the VB1 12 rise to potentials that can turn on the diodes 31 and 32, because of leak currents flowing through the MOSFETs having small absolute values of threshold voltages and included in the two-input NAND gate 1 and the latch circuit 20.

Referring next to FIG. 2, there is illustrated a timing chart showing potentials at some important points of the semiconductor integrated circuit device of FIG. 1. In the figure, reference numeral 8a denotes the potential of the VA1 8, 12a denotes the potential of the VB1 12, and 27a denotes the potential of the power supply 27. The horizontal axis of FIG. 2 shows time. Reference character I and III show time periods during which both the two-input NAND gate 1 and the latch circuit 20 are activated, and II shows a time period during which they are deactivated, i.e., they are brought into sleep. In FIG. 2, it is assumed that the power supply 27 can provide a lower potential or first potential of 1.0 Volt and a higher potential or second potential of 3.3 Volts, and the diodes 31 and 32 have an on voltage of 0.6 Volts. During the time periods I and III, both the potentials 27a and 8a of the power supply 27 and the VA1 8 are held at 1.0 Volt, and the potential 12a of the VB1 12 is held at 0 Volts. When both the two-input NAND gate 1 and the latch circuit 20 are deactivated, both the potentials of the VA1 8 and the VB1 12 rise since the potential 27a of the power supply 27 rises to 3.3 Volts, as shown in FIG. 2. As a result, the potential 8a of the VA1 8 rises to a potential which is less than the potential 27a of the power supply 27 by the on voltage V1 of the diode 31, and the potential 12a of the VB1 12 rises to a potential which is greater than the potential of the GND 11 by the on voltage V2 of the diode 32.

In general, a diode has the property of causing a current therethrough when the voltage between its anode and cathode exceeds its on voltage and then clamping the voltage between its anode and cathode at the on voltage.

Therefore, the rises in the potentials 8a and 12a of the VA1 8 and the VB1 12 are limited by the above-mentioned on voltages of the diodes, so that they have potentials as mentioned above finally. As a result, the potentials 8a and 12a of the VA1 8 and the VB1 12 are held at 2.7 Volts and 0.6 Volts, respectively, within the time period II during which both the two-input NAND gate 1 and the latch circuit 20 are not in active use. It is to be noted that each of the p-channel MOSFETs 2, 3, 21, and 22 included in the two-input NAND gate 1 and the latch circuit 20 has its source node connected to the VA1 8 and its substrate terminal connected to the power supply 27, and therefore the source of each of the p-channel MOSFETs is held at a potential greater than that of the substrate by 0.6 Volts, that is, each of the p-channel MOSFETs 2, 3, 21, and 22 is reverse-biased. It is also to be noted that each of the n-channel MOSFETs 5, 23, and 24 included in the two-input NAND gate 1 and the latch circuit 20 has its source node connected to the VB1 12 and its substrate terminal connected to the GND 11, and therefore the source of each of the n-channel MOSFETs is held at a potential greater than that of the substrate by 0.6 Volts, that is, each of the n-channel MOSFETs 5, 23, and 24 is reverse-biased. By the way, the source of the n-channel MOSFET 4 is connected to the drain of the n-channel MOSFET 5, and the drain of the n-channel MOSFET 5 is held at a potential equal to or greater than the potential of the VB1 12. Therefore, the difference between the source potential and the substrate potential of the n-channel MOSFET 4 becomes greater than 0.6 Volts, and hence the n-channel MOSFET 4 is brought into a state in which it is more strongly reverse-biased than the other n-channel MOSFETs 5, 23, and 24.

In general, a MOSFET has the property that the absolute value of its threshold voltage rises in a case where a reverse-bias voltage is applied between the source and substrate of the MOSFET, compared with a case where the potential of the source is held at a potential equal to that of the substrate, and the amount of the rise in the absolute value of the threshold voltage increases with an increase in the reverse-bias voltage. Accordingly, when both the two-input NAND gate 1 and the latch circuit 20 having the structures as shown in FIG. 1 are not in active use, the absolute values of the threshold voltages of all the MOSFETs which construct both the two-input NAND gate 1 and the latch circuit 20 become greater than those when they are activated. As a result, leakage currents flowing through all the MOSFETs included in the two-input NAND gate 1 and the latch circuit 20 can be reduced. In addition, since both the VA1 8 and the VB1 12 are held at constant potentials by the leakage currents flowing through the MOSFETs included in the two-input NAND gate 1 and the latch circuit 20, and by the diodes 31 and 32, the potentials of the input/output nodes of the two-input NAND gate 1 and the storage node of the latch circuit 20 are held at immediately preceding states and hence data stored at the storage node of the latch circuit cannot be erased.

As previously mentioned, the two-input NAND gate 1 and latch circuit 20 of the semiconductor integrated circuit device according to the first embodiment can operate at a high speed by means of MOSFETs each having a small absolute value of its threshold voltage under operating conditions. Furthermore, when the two-input NAND gate 1 and the latch circuit 20 are deactivated, the threshold voltages of all the MOSFETs, which construct the two-input NAND gate 1 and the latch circuit 20, become greater than those when they are activated. As a result, leakage currents flowing through the MOSFETs included in the two-input NAND gate 1 and the latch circuit 20 can be reduced. In addition, since both the VA1 8 and the VB1 12 are held at constant potentials by the leakage currents flowing through the MOSFETs included in the two-input NAND gate 1 and the latch circuit 20, and by the diodes 31 and 32, the potentials of the input/output nodes of the two-input NAND gate 1 and the storage node of the latch circuit 20 are held at immediately preceding states and hence data stored at the storage node of the latch circuit cannot be erased.

Numerous variants may be made in the exemplary first embodiment mentioned above. In a variant, when the two-input NAND gate 1 and the latch circuit 20 are deactivated, the potential of the power supply 27 can be set to the same potential as when they are activated, instead of setting the potential of the power supply 27 to a high potential of 3.3 Volts. In this case, leakage currents flowing through the MOSFETs included in the two-input NAND gate 1 and the latch circuit 20 can be reduced, and the potentials of the input/output nodes of the two-input NAND gate 1 and the storage node of the latch circuit 20 can be held at immediately preceding states and hence data stored at the storage node of the latch circuit cannot be erased, like the first embodiment mentioned above. It is also apparent that instead of the control signals 9 and 13 having opposite phases, the semiconductor integrated circuit device can use two different control signals which can turn the p-channel MOSFET 6 and the n-channel MOSFET 10 on or off, respectively, when activating or deactivating the two-input NAND gate 1 and the latch circuit 20.

Second Embodiment

Figure 3:
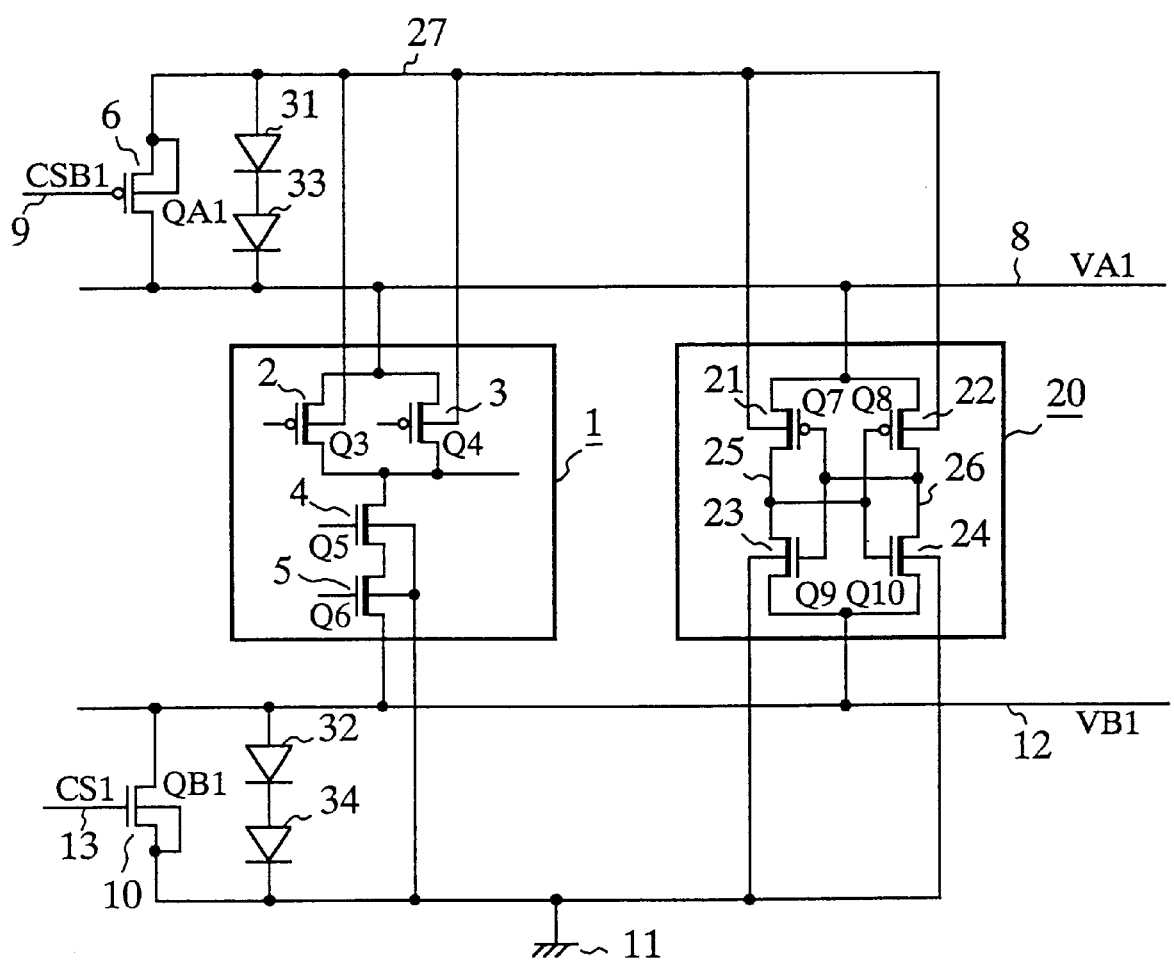
FIG. 3 is a schematic circuit diagram showing a semiconductor integrated circuit device according to a second embodiment of the present invention.

Referring next to FIG. 3, there is illustrated a schematic circuit diagram showing a semiconductor integrated circuit device according to a second embodiment of the present invention. In the figure, reference numeral 33 denotes a diode connected in series to another diode 31 which constructs a first voltage drop circuit in cooperation with the diode 33, and 34 denotes a diode connected in series to another diode 32 which constructs a second voltage drop circuit in cooperation with the diode 34. The other structure of the semiconductor integrated circuit device of the second embodiment is the same as that of the semiconductor integrated circuit device of the first embodiment mentioned above, and therefore the description about the other structure will be omitted hereafter.

The two diodes 31 and 32 in series and the two other diodes 32 and 34 in series as shown in FIG. 3 cause the potentials of the VA1 8 and the VB1 12 to vary more widely compared with the first embodiment when bringing the two-input NAND gate 1 and the latch circuit 20 into sleep.

Referring next to FIG. 4, there is illustrated a timing chart showing potentials at some important points of the semiconductor integrated circuit device shown in FIG. 3. When the two diodes 31 and 33 of the first voltage drop circuit are turned on, the voltage across the first voltage drop circuit becomes two times as large as the on voltage V1 of the diodes 31 and 33, as shown in FIG. 4. Similarly, when the two diodes 32 and 34 of the second voltage drop circuit are turned on, the voltage across the second voltage drop circuit becomes two times as large as the on voltage V2 of the diodes 32 and 34. As a result, when both the two-input NAND gate 1 and the latch circuit 20 are deactivated, the potentials of the VA1 8 and the VB1 12 are held at 2.1 Volts and 1.2 Volts, respectively.

Accordingly, when the two-input NAND gate 1 and the latch circuit 20 are deactivated or brought into sleep, the absolute values of the threshold voltages of the MOSFETs which construct the two-input NAND gate 1 and the latch circuit 20 become greater than those of the first embodiment. As a result, leakage currents flowing through the MOSFETs included in the two-input NAND gate 1 and the latch circuit 20 can be further reduced. Furthermore, since a potential difference of 0.9 Volts is established between the VA1 8 and the VB1 12 while the two-input NAND gate 1 and the latch circuit 20 are held in a sleep state, the storage node of the latch circuit 20 can be held at immediately preceding states and hence data stored at the storage node of the latch circuit cannot be erased.

As previously mentioned, the semiconductor integrated circuit device according to the second embodiment can reduce leakage currents by a larger amount compared with the first embodiment when the two-input NAND gate 1 and the latch circuit 20 are deactivated, thereby reducing its power consumption.

In a variant of the second embodiment, three or more diodes can be connected in series in either of the first and second voltage drop circuits to adjust the on voltages across either of the first and second voltage drop circuits. In this case, the same advantage as offered by the second embodiment mentioned above can be provided.

Third Embodiment

Figure 5:
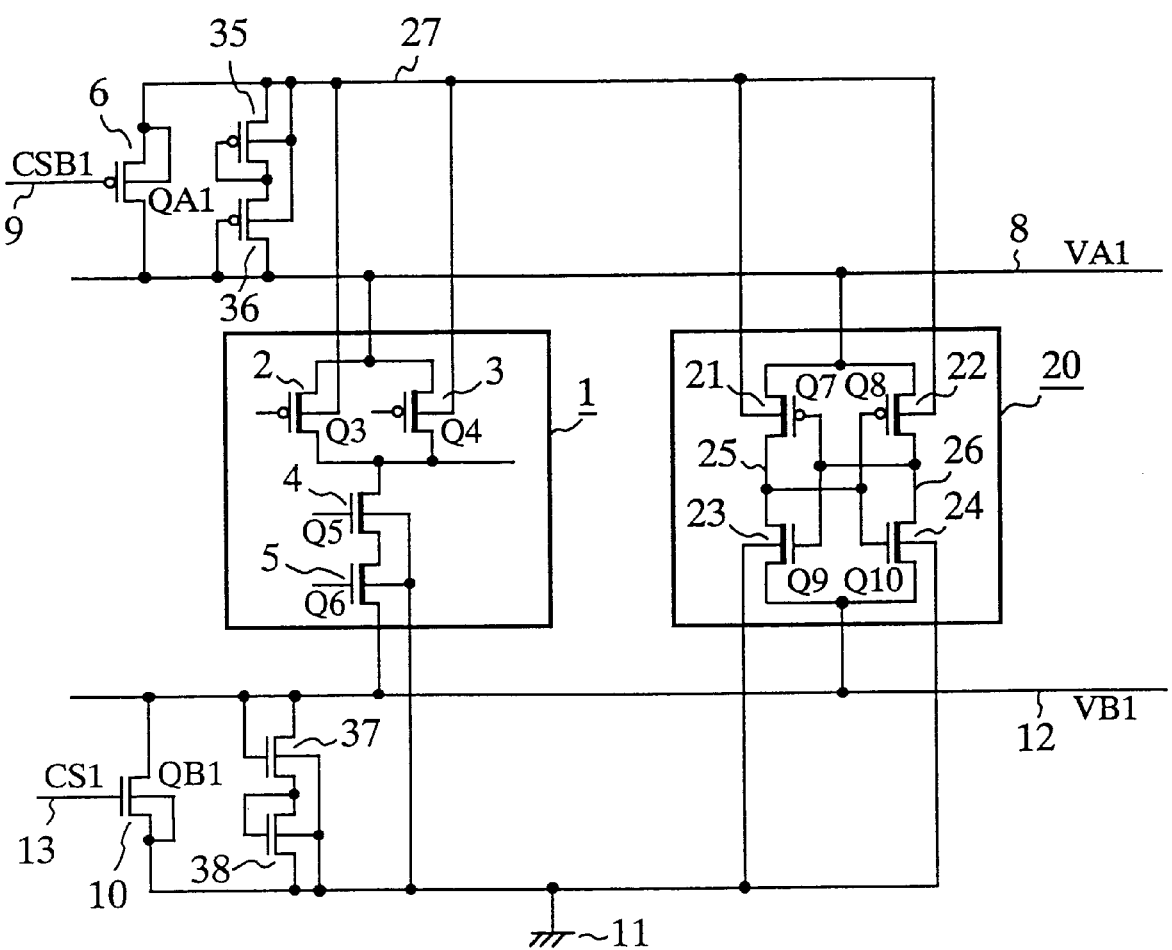
FIG. 5 is a schematic circuit diagram showing a semiconductor integrated circuit device according to a third embodiment of the present invention.

Referring next to FIG. 5, there is illustrated a schematic circuit diagram showing a semiconductor integrated circuit device according to a third embodiment of the present invention. In the figure, reference numerals 35 and 36 denote p-channel MOSFETs connected in series to each other and having a large threshold voltage, which serve as a first voltage circuit. Each of the p-channel MOSFETs 35 and 36 has a gate and a drain connected in common to each other. Furthermore, reference numerals 37 and 38 denote n-channel MOSFETs connected in series to each other and having a large threshold voltage, which serve as a second voltage circuit. Each of the n-channel MOSFETs 37 and 38 has a gate and a drain connected in common to each other. The other structure of the semiconductor integrated circuit device of the third embodiment is the same as that of the semiconductor integrated circuit device of the first embodiment mentioned above, and therefore the description about the other structure will be omitted hereafter. Thus, the first voltage drop circuit of the semiconductor integrated circuit device of the third embodiment includes the two p-channel MOSFETs 35 and 36 as a substitute for the diodes 31 and 33 of the second embodiment as shown in FIG. 3, and the second voltage drop circuit of the semiconductor integrated circuit device of the third embodiment includes the two n-channel MOSFETs 37 and 38 as a substitute for the diodes 32 and 34.

In general, it can be assumed that either of an n-channel MOSFET having a positive threshold voltage and a p-channel MOSFET having a negative threshold voltage serves as a diode causing a voltage drop which is equal to its threshold voltage when the diode or MOSFET is turned on, in case where the drain and gate of the MOSFET are connected in common to each other. Therefore, the semiconductor integrated circuit device of the third embodiment can operate similar to that of the second embodiment. All of the semiconductor integrated circuit device can be thus implemented using only MOSFETs without the provision of specific diode elements which serve as the first and second voltage drop circuits. In addition, since the threshold voltages of the MOSFETs included the first and second voltage drop circuits can be adjusted when the semiconductor integrated circuit device is manufactured, the first and second voltage drop circuits can generate arbitrary on voltages according to the adjustment.

As previously mentioned, the third embodiment of the present invention can offer the same advantage as that provided by the second embodiment by forming the first and second voltage drop circuit using p-channel MOSFETs and n-channel MOSFETs, respectively. In addition, since all of the semiconductor integrated circuit device can be implemented using only MOSFETs without having to provide specific diode elements, the semiconductor integrated circuit device can be easily manufactured.

In the third embodiment mentioned above, the first voltage drop circuit disposed on the side of the power supply 27 can be constructed of the p-channel MOSFETs 35 and 36, and the second voltage drop circuit disposed on the side of the GND 11 can be constructed of the n-channel MOSFETs 37 and 38. Alternatively, the first voltage drop circuit disposed on the side of the power supply 27 can be constructed of n-channel MOSFETs, and the second voltage drop circuit disposed on the side of the GND 11 can be constructed of p-channel MOSFETs. Instead, both the first and second voltage drop circuits can be either p-channel MOSFETs or n-channel MOSFETs. Those alternatives can offer the same advantage.

In a variant of the third embodiment, each of the first and second voltage drop circuits can be comprised of either one or more p-channel MOSFETs in series or one or more n-channel MOSFETs in series. The number of MOSFETs included in each of the first and second voltage drop circuits can be chosen according to a desired on voltage across each of the first and second voltage drop circuits.

In another variant of the third embodiment, instead of MOSFETs having large threshold voltages, each of the first and second voltage drop circuits includes MOSFETs having small threshold voltages.

Fourth Embodiment

Figure 6:
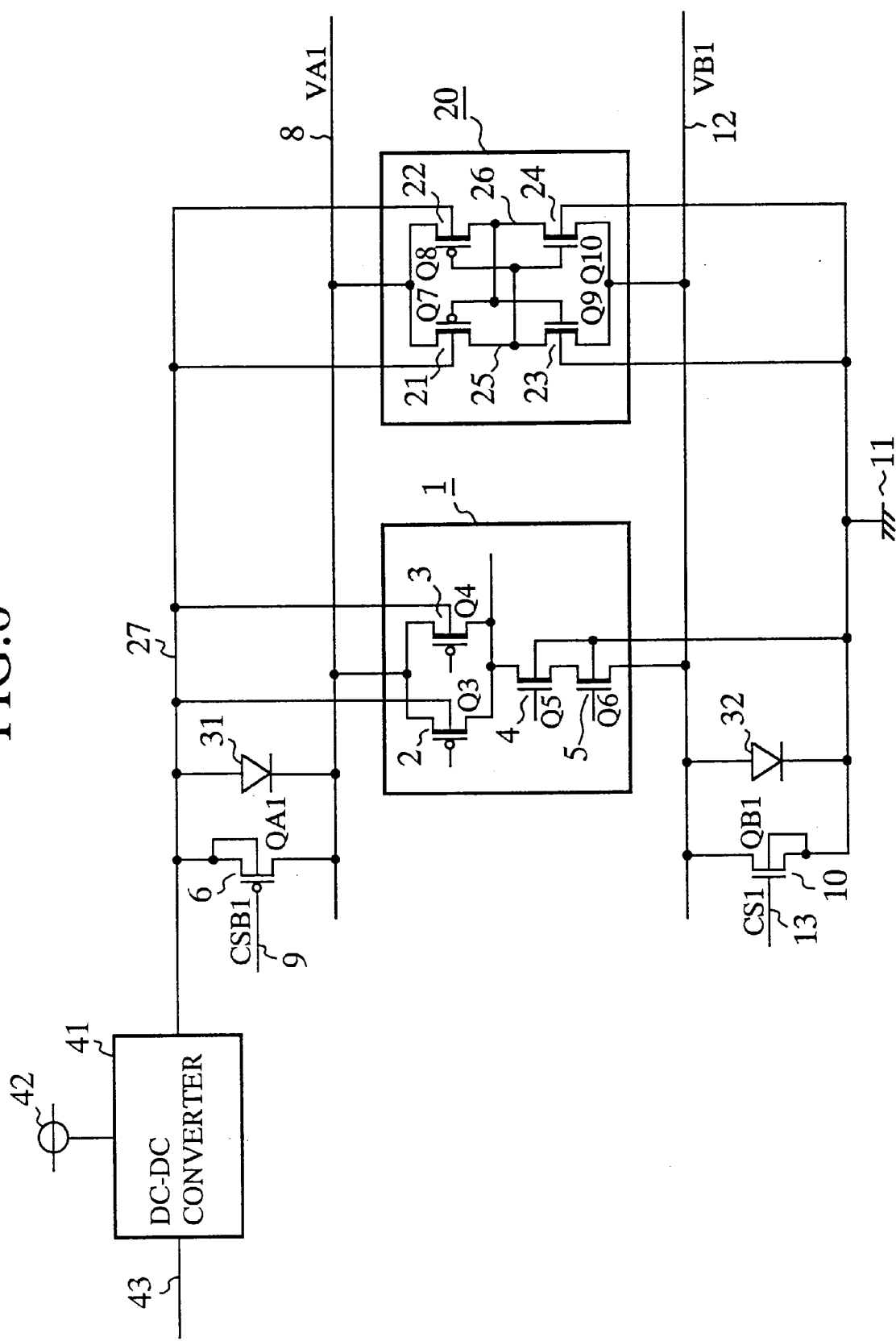
FIG. 6 is a schematic circuit diagram showing a semiconductor integrated circuit device according to a fourth embodiment of the present invention.

Referring next to FIG. 6, there is illustrated a schematic circuit diagram showing a semiconductor integrated circuit device according to a fourth embodiment of the present invention. In the figure, reference numeral 41 denotes a DC-DC converter, responsive to a control signal 43, for converting the potential of a power supply 42 to a predetermined potential and then applies the predetermined potential to a power supply 27. The other structure of the fourth embodiment is the same as that of the first embodiment shown in FIG. 1, and the same components as of the first embodiment are designated by the same reference numerals as shown in FIG. 1. The description about the same components will be therefore omitted hereafter.

The fourth embodiment is a concrete example of the first embodiment mentioned above. That is, the semiconductor integrated circuit device of the fourth embodiment as shown in FIG. 6 can set the potential of the power supply 27 to either a first or second potential by means of the DC-DC converter 41 when activating or deactivating a two-input NAND gate 1 and a latch circuit 20. When activating the two-input NAND gate 1 and the latch circuit 20, the control signal 43 at a HIGH logic level is applied to the DC-DC converter 41. In response to the control signal 43 at a HIGH logic level, the DC-DC converter 41 converts the potential of the power supply 42 into a low potential or first potential so as to set the potential of the power supply 27 to the first potential. A control signal 9 at a LOW logic level and a control signal 13 at a HIGH logic level are then applied to the p-channel MOSFET 6 and the n-channel MOSFET 10, respectively. As a result, the MOSFETs are turned on, and hence the two-input NAND gate 1 and the latch circuit 20 can operate from the low potential from the power supply 27 at a high speed. On the other hand, when deactivating or bringing the two-input NAND gate 1 and the latch circuit 20 into a sleep state, the control signal 43 at a LOW logic level is applied to the DC-DC converter 41. In response to the control signal 43 at a LOW logic level, the DC-DC converter 41 converts the potential of the power supply 42 into a high potential or second potential and then sets the potential of the power supply 27 to the second potential. Then the control signal 9 is caused to make a LOW to HIGH transition and the control signal 13 is caused to make a HIGH to LOW transition. As a result, the p-channel MOSFET 6 and the n-channel MOSFET 10 are brought into an off state. As previously mentioned in First Embodiment, when both the two-input NAND gate 1 and the latch circuit 20 having the structures as shown in FIG. 1 are deactivated, the absolute values of the threshold voltages of all the MOSFETs included in both the two-input NAND gate 1 and the latch circuit 20 become greater than those when they are activated. Therefore, leakage currents flowing through all the MOSFETs included in the two-input NAND gate 1 and the latch circuit 20 can be reduced.

As previously mentioned, the fourth embodiment can implement the function of the first embodiment by applying a predetermined potential to the power supply 27 by means of the DC-DC converter 41.

Numerous variants may be made in the exemplary fourth embodiment shown. It is apparent that the DC-DC converter is so constructed as to only convert the potential of the power supply 42 into a low potential which is the same as the first potential mentioned above. It is also apparent that either the control signal 9 or the control signal 13 can be used as the control signal 43. Furthermore, in a variant, either the second embodiment or the third embodiment can be applied to the fourth embodiment. In this case, the same advantage as that provided by the second or third embodiment can be offered.

Fifth Embodiment

Figure 7:
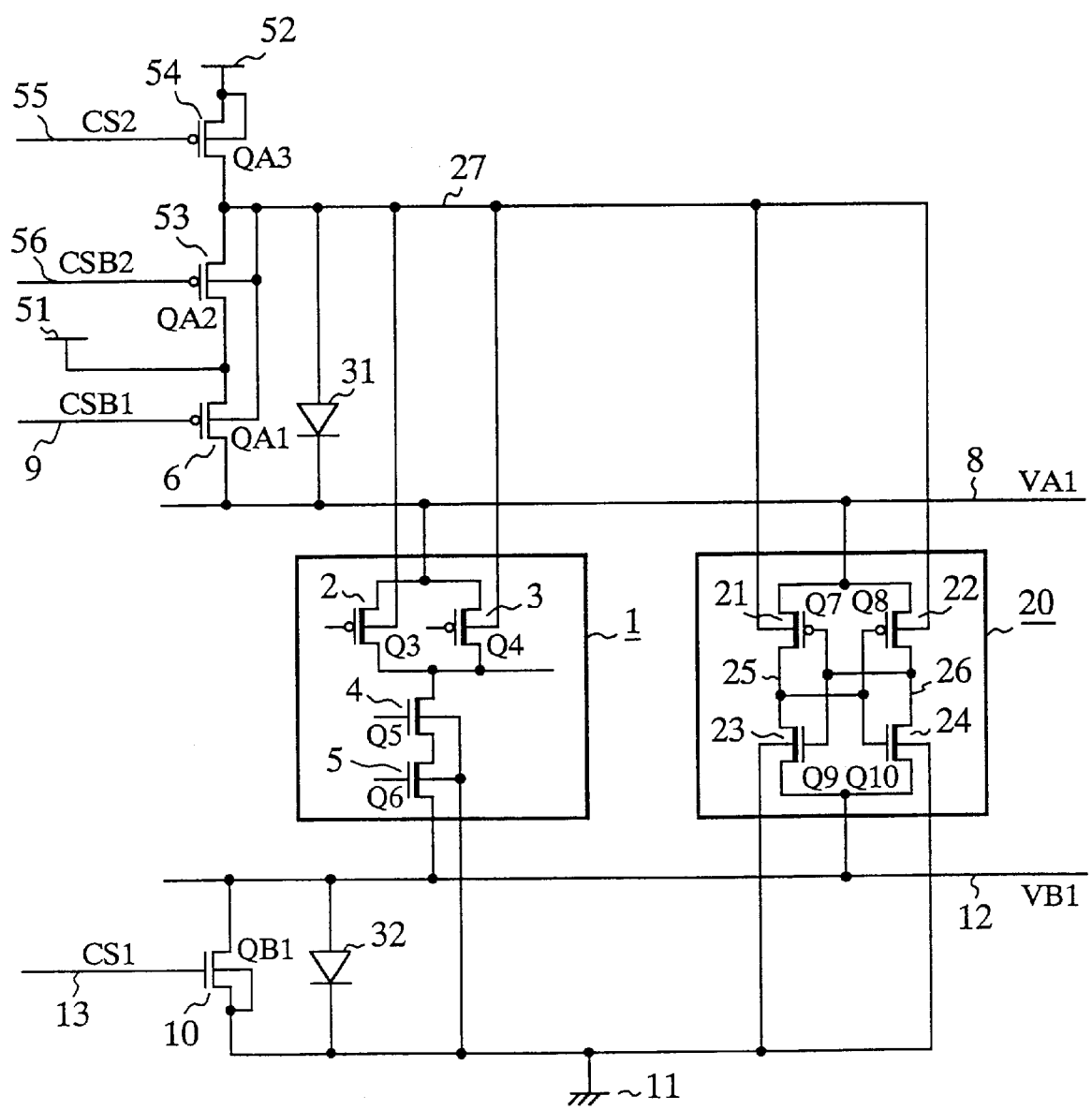
FIG. 7 is a schematic circuit diagram showing a semiconductor integrated circuit device according to a fifth embodiment of the present invention.

Referring next to FIG. 7, there is illustrated a schematic circuit diagram showing a semiconductor integrated circuit device according to a fifth embodiment of the present invention. In the figure, reference numeral 51 denotes a power supply, 52 denotes another power supply having a potential greater than that of the power supply 51, 6 denotes a p-channel MOSFET connected between the power supply 51 and VA1 8, and 53 denotes a p-channel MOSFET connected between the power supply 51 and a power supply 27. Each of the p-channel MOSFETs 6 and 53 has a substrate terminal connected to the power supply 27. Furthermore, reference numeral 54 denotes a p-channel MOSFET connected between the power supply 27 and the power supply 52, and 10 denotes an n-channel MOSFET connected between GND 11 and VB1 12. The p-channel MOSFET 54 has a substrate terminal connected to the power supply 52. The n-channel MOSFET 10 has a substrate terminal connected to the GND 11. In addition, reference numerals 55 and 56 denote control signals. A control signal 13 applied to the n-channel MOSFET 10 can also be used as the control signal 55, and a control signal 9 applied to the p-channel MOSFET 6 can also be used as the control signal 56. The other structure of the fifth embodiment is the same as that of the first embodiment shown in FIG. 1, and the same components as of the first embodiment are designated by the same reference numerals as shown in FIG. 1. The description about the same components will be therefore omitted hereafter.

When activating a two-input NAND gate 1 and a latch circuit 20, control signals 13 and 55 at a HIGH logic level and control signals 9 and 56 at a LOW logic level are applied to the semiconductor integrated circuit device of this embodiment. Then the p-channel MOSFETs 6 and 53, and the n-channel MOSFET 10 are turned on, and the p-channel MOSFET 54 is turned off. As a result, a low potential from the power supply 51 is applied to both the power supply 27 and the VA1 8. Simultaneously, the VB1 12 has the same potential as the GND 11. This results in causing the two-input NAND gate 1 and the latch circuit 20 to operate from the low potential from the power supply 51 at a high speed in the same manner as the first embodiment.

When deactivating or bringing the two-input NAND gate 1 and the latch circuit 20 into a sleep state, the control signals 13 and 55 are caused to make a HIGH to LOW transition and the control signals 9 and 56 are caused to make a LOW to HIGH transition. Then the p-channel MOSFETs 6 and 53, and the n-channel MOSFET 10 are turned off, and the p-channel MOSFET 54 is turned on. As a result, a high potential from the power supply 52 is applied to the power supply 27. This results in reducing leakage currents flowing through the MOSFETs included in the two-input NAND gate 1 and the latch circuit 20 in the same manner as the first embodiment.

As previously mentioned, the fifth embodiment can implement the function of the first embodiment by applying a predetermined potential to the power supply 27 by means of a simple circuit comprised of p-channel MOSFETs without having to use a DC-DC converter capable of varying its output potential as mentioned in the fourth embodiment.

In a variant of the exemplary fifth embodiment shown, instead of the control signals 13 and 55, and 9 and 56 having opposite phases, the semiconductor integrated circuit device can use four different control signals which can turn on the n-channel MOSFET 10 and the p-channel MOSFETs 9 and 53, and turn off the p-channel MOSFET 54, respectively, when activating the two-input NAND gate 1 and the latch circuit 20. This variant can offer the same advantage as that provided by the fifth embodiment.

Sixth Embodiment

Figure 8:
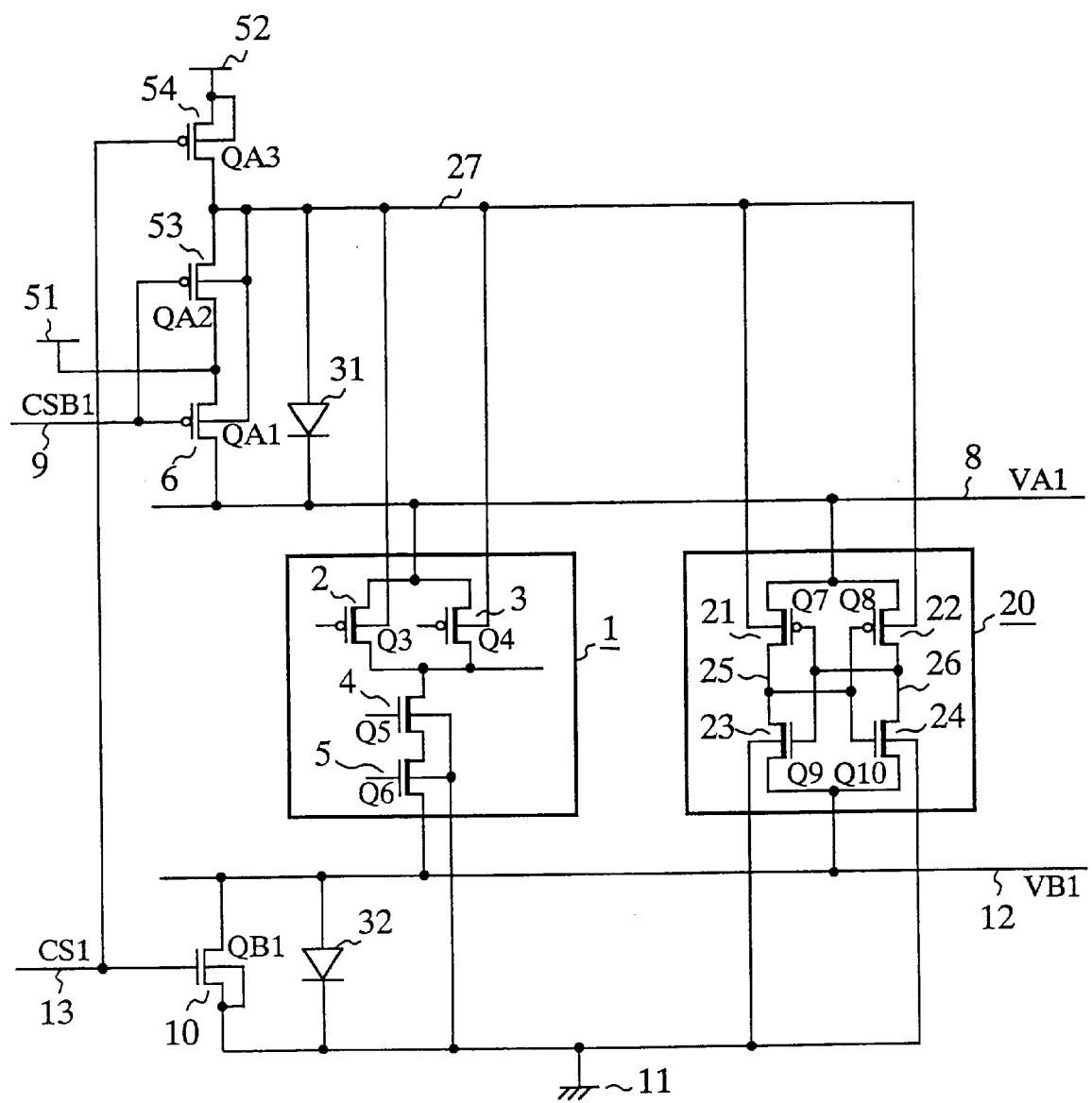
FIG. 8 is a schematic circuit diagram showing a semiconductor integrated circuit device according to a sixth embodiment of the present invention.

Referring next to FIG. 8, there is illustrated a schematic circuit diagram showing a semiconductor integrated circuit device according to a sixth embodiment of the present invention. In the semiconductor integrated circuit device of this embodiment, a control signal 9 is applied to p-channel MOSFETs 6 and 53 so as to control the MOSFETs, and a control signal 13 which is the inversion of the control signal 9 is applied to a p-channel MOSFET 54 and an n-channel MOSFET 10 so as to control the MOSFETs, as shown in FIG. 8. The other structure of the sixth embodiment is the same as that of the fifth embodiment shown in FIG. 7, and the same components as of the fifth embodiment are designated by the same reference numerals as shown in FIG. 7. The description about the same components will be therefore omitted hereafter.

Accordingly, the sixth embodiment can reduce the number of control signals to be applied to the semiconductor integrated circuit device without impairment of the advantage offered by the fifth embodiment, thereby reducing the effective area of the semiconductor integrated circuit device chip.

Figure 9:
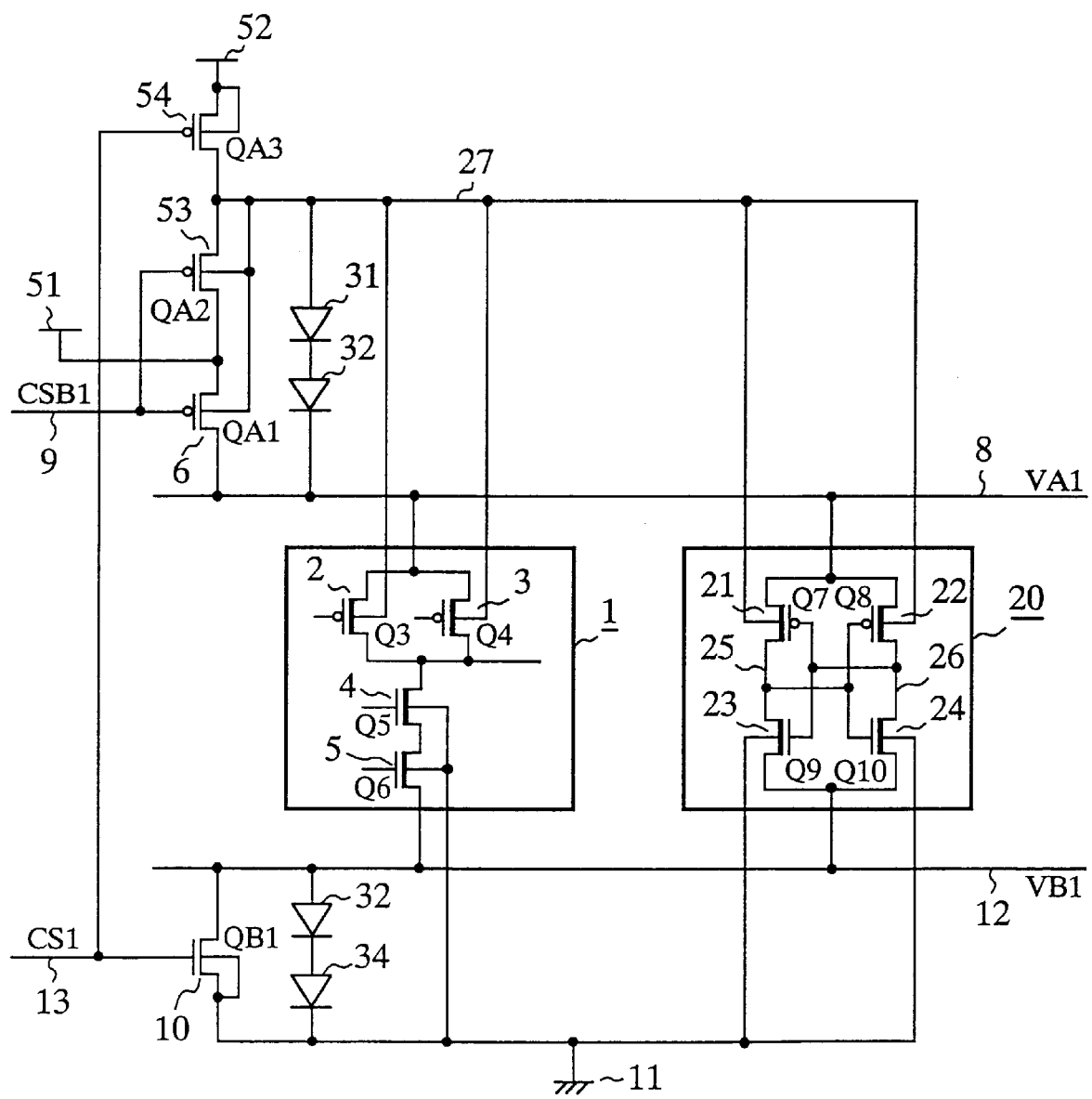
FIG. 9 is a schematic circuit diagram showing a semiconductor integrated circuit device according to a variant of the sixth embodiment.

Numerous variants may be made in the exemplary sixth embodiment shown. Referring next to FIG. 9, there is illustrated a schematic circuit diagram showing a semiconductor integrated circuit device according to a variant of the sixth embodiment. In the variant, the first voltage drop circuit is comprised of two diodes 31 and 33 connected in series to each other, and the second voltage drop circuit is comprised of two diodes 32 and 34 connected in series to each other, like the second embodiment mentioned above. Accordingly, the variant can further reduce leakage currents flowing through the MOSFETs included in the two-input NAND gate 1 and the latch circuit 20 when the two-input NAND gate 1 and the latch circuit 20 are brought into a sleep state, compared with the sixth embodiment, as explained in Second Embodiment.

Figure 10:
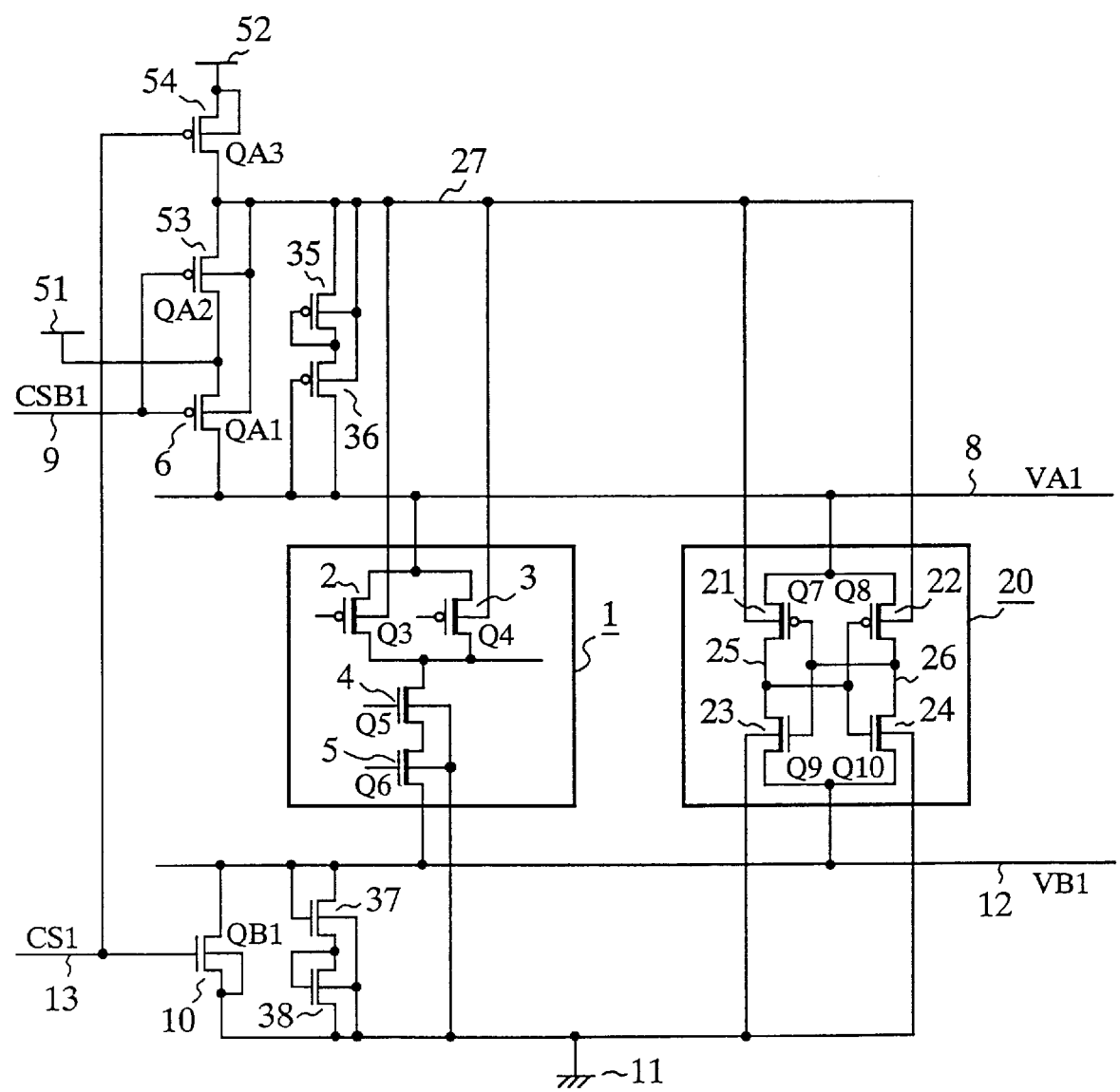
FIG. 10 is a schematic circuit diagram showing a semiconductor integrated circuit device according to another variant of the sixth embodiment.

Referring next to FIG. 10, there is illustrated a schematic circuit diagram showing a semiconductor integrated circuit device according to another variant of the sixth embodiment. In the variant, the first voltage drop circuit is comprised of two p-channel MOSFETs 35 and 36 connected in series to each other, and the second voltage drop circuit is comprised of two n-channel MOSFETs 37 and 38 connected in series to each other, like the third embodiment mentioned above. Accordingly, since all of the semiconductor integrated circuit device can be implemented using only MOSFETs without having to provide specific diode elements, the semiconductor integrated circuit device can be easily manufactured.

Figure 11:
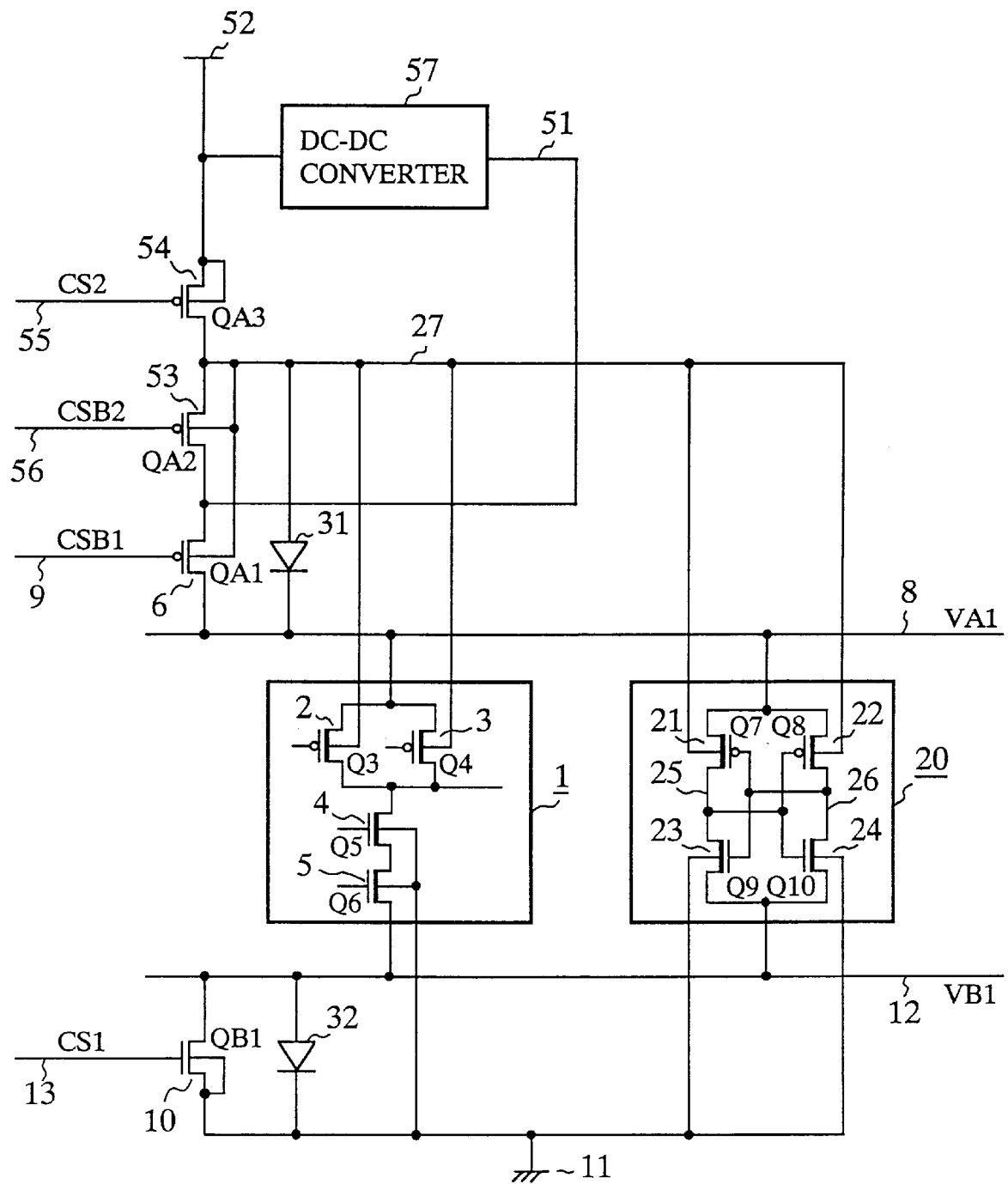
FIG. 11 is a schematic circuit diagram showing a semiconductor integrated circuit device according to another variant of the sixth embodiment.

Referring next to FIG. 11, there is illustrated a schematic circuit diagram showing a semiconductor integrated circuit device according to another variant of the sixth embodiment. The semiconductor integrated circuit device of the variant is provided with a DC-DC converter 57 for generating the potential of a power supply 51 from the potential of a power supply 52 and then applying the potential of the power supply 51 to a power supply 27 and VA1 8 when activating a two-input NAND gate 1 and a latch circuit 20, as shown in FIG. 11. The DC-DC converter 57 can be implemented as a low voltage generating circuit for generating a low voltage from a high voltage because the potential of the power supply 51 is less than that of the power supply 52. Thus the variant can offer the same advantage as that provided by the fifth embodiment using only the single power supply 52 connected to an external power source.

Figure 12:
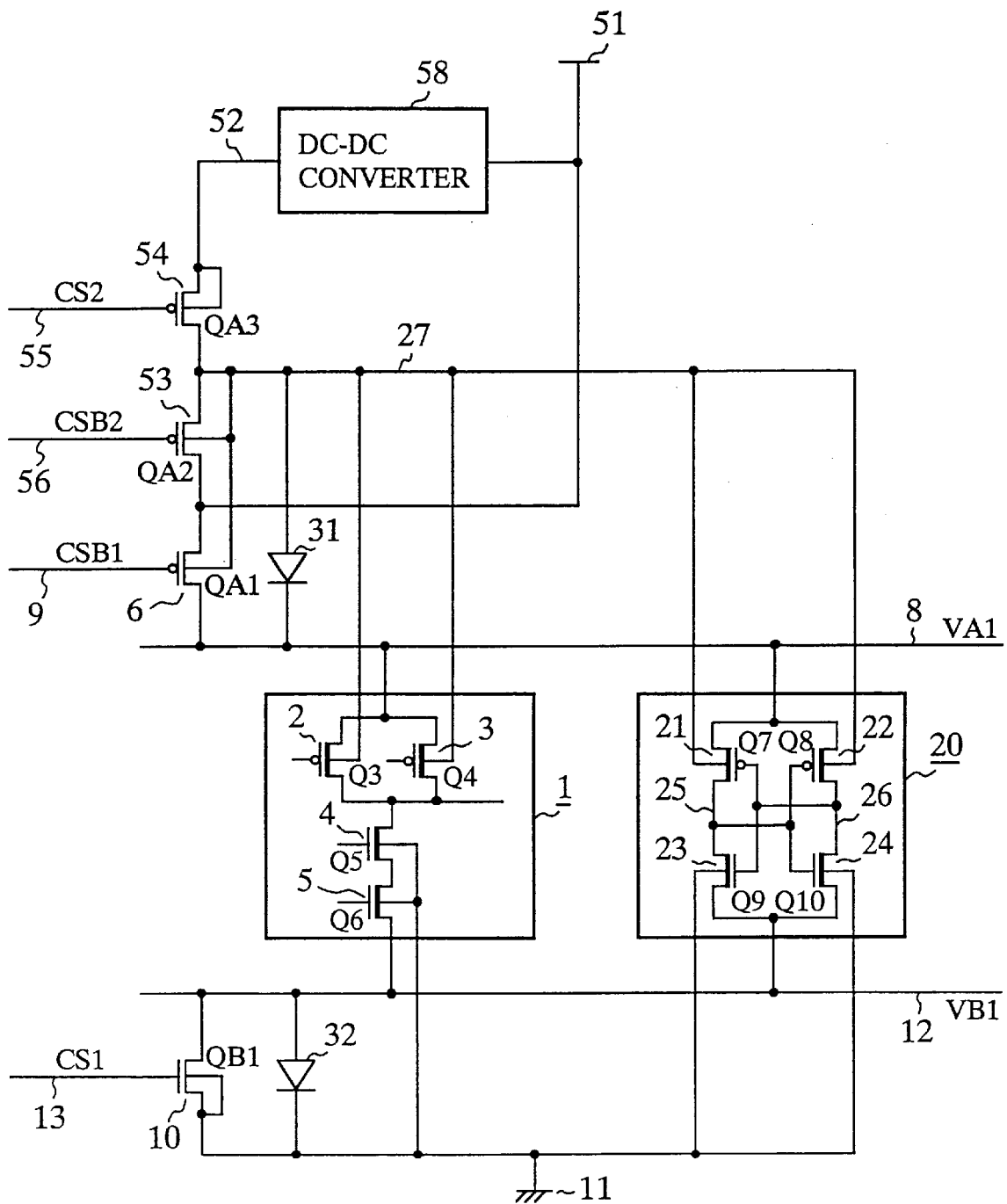
FIG. 12 is a schematic circuit diagram showing a semiconductor integrated circuit device according to another variant of the sixth embodiment.

Referring next to FIG. 12, there is illustrated a schematic circuit diagram showing a semiconductor integrated circuit device according to another variant of the sixth embodiment. The semiconductor integrated circuit device of the variant is provided with a DC-DC converter 58 for generating the potential of a power supply 52 from the potential of a power supply 51 and then applying the potential of the power supply 52 to a power supply 27 when deactivating or bringing a two-input NAND gate 1 and a latch circuit 20 into a sleep state. The DC-DC converter 58 can be implemented as a high voltage generating circuit for generating a high voltage from a low voltage because the potential of the power supply 51 is less than that of the power supply 52. Thus the variant can offer the same advantage as that provided by the fifth embodiment using only the single power supply 51 connected to an external power source.

Seventh Embodiment

Figure 13:
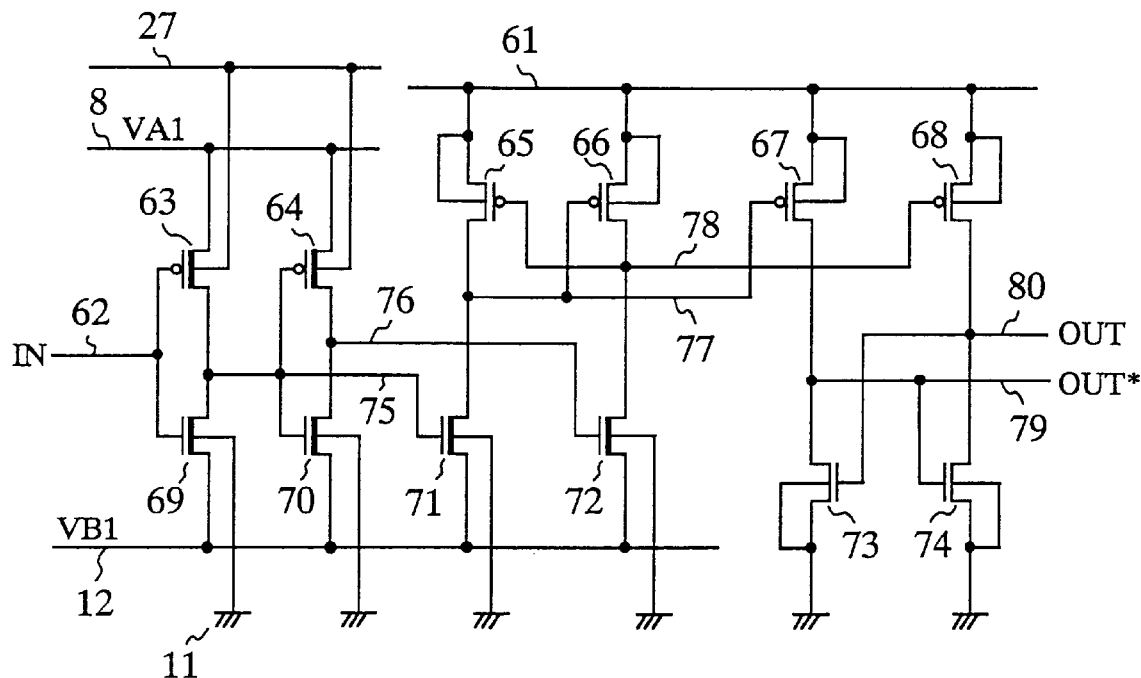
FIG. 13 is a schematic circuit diagram showing a semiconductor integrated circuit device according to a seventh embodiment of the present invention.

Referring next to FIG. 13, there is illustrated a schematic circuit diagram showing a semiconductor integrated circuit device according to a seventh embodiment of the present invention, which implements or serves as an interface circuit. In the figure, reference numeral 27 denotes a first power supply having a potential of 1.0 Volt when a two-input NAND gate and a latch circuit located at the front of the interface circuit is activated, and a potential of 3.3 Volts when the two-input NAND gate and the latch circuit are deactivated or brought into sleep, 11 denotes a second power supply or GND having a potential of ground, 8 denotes a first power supply line VA1 having a potential of 1.0 Volt when the two-input NAND gate and the latch circuit are activated, and a potential of 2.7 Volts when the two-input NAND gate and the latch circuit are deactivated, and 12 denotes a second power supply line VB1 having a potential of 0 Volts when the two-input NAND gate and the latch circuit are activated, and a potential of 0.6 Volts when the two-input NAND gate and the latch circuit are deactivated.

Furthermore, reference numeral 61 denotes a third power supply with a potential having the same value as a high potential in another circuit located at the back of the interface circuit shown in FIG. 13. In this case, the third power supply 61 has a potential of 3.3 Volts typically. Reference numeral 62 denotes an input node for receiving an input signal from for example either the two-input NAND gate 1 or the latch circuit 20 as shown in FIG. 1.

Reference numerals 63 to 68 denote p-channel MOSFETs, and 69 to 74 denote n-channel MOSFETs. The absolute values of the threshold voltages of the p-channel MOSFETs 63 and 64 are set to be less than those of the p-channel MOSFETs 65 to 68. The absolute values of the threshold voltages of the n-channel MOSFETs 69 to 72 are set to be less than those of the n-channel MOSFETs 73 and 74.

The p-channel MOSFET 63 and the n-channel MOSFET 69 are connected in series to each other between the VA1 8 and the VB1 12. The p-channel MOSFET 64 and the n-channel MOSFET 70 are also connected in series to each other between the VA1 8 and the VB1 12. Each of the p-channel MOSFETs 63 and 64 has a substrate terminal connected to the first power supply 27, and each of the n-channel MOSFETs 69 and 70 has a substrate terminal connected to the GND 11. These p-channel and n-channel MOSFETs construct a level determining circuit which can determine if an input signal applied to the input node 62, which can be an output signal from either the two-input NAND gate 1 or the latch circuit 20 as shown in FIG. 1, has a HIGH or LOW logic level.

The p-channel MOSFET 65 and the n-channel MOSFET 71 are connected in series to each other between the power supply 61 and the VB1 12. The p-channel MOSFET 66 and the n-channel MOSFET 72 are also connected in series to each other between the power supply 61 and the VB1 12.

Each of the p-channel MOSFETs 65 and 66 has a substrate terminal connected to the third power supply 61, and each of the n-channel MOSFETs 71 and 72 has a substrate terminal connected to the GND 11. These p-channel and n-channel MOSFETs construct a first level converting circuit which, in response to signals at nodes 75 and 76, can generate a first signal having the same potential as the third power supply 61, and a second signal having the same potential as the second power supply line VB1 12.

The p-channel MOSFET 67 and the n-channel MOSFET 73 are connected in series to each other between the third power supply 61 and the GND 11. The p-channel MOSFET 68 and the n-channel MOSFET 74 are also connected in series to each other between the third power supply 61 and the GND 11. Each of the p-channel MOSFETs 67 and 68 has a substrate terminal connected to the third power supply 61, and each of the n-channel MOSFETs 73 and 74 has a substrate terminal connected to the GND 11. These p-channel and n-channel MOSFETs construct a second level converting circuit which, in response to the signals from the first level converting circuit, can generate an output signal having the same potential as the power supply 61, and another output signal having the same potential as the GND 11.

In general, a prior art semiconductor integrated circuit device operates from a single power supply having a voltage of for example 3.3 Volts, and hence the levels of input signals applied to the prior art semiconductor integrated circuit device and output signals from the semiconductor integrated circuit device are in the range of 0 to 3.3 Volts. Furthermore, there is no change in the levels of input and output signals regardless of whether the semiconductor integrated circuit device is activated or deactivated, unlike the aforementioned embodiments of the present invention. In the semiconductor integrated circuit device of the aforementioned first embodiment, the levels of signals are in the range of 0 to 1.0 Volt when the two-input NAND gate and the latch circuit of the semiconductor integrated circuit device are activated, and the levels of signals are in the range of 0.6 to 2.7 Volts when the two-input NAND gate and the latch circuit of the semiconductor integrated circuit device are deactivated or brought into sleep, as shown in FIG. 2. If such the signals having levels which vary between when the two-input NAND gate and the latch circuit of the semiconductor integrated circuit device are activated and when they are deactivated are input to another prior art circuit located at the next stage of the semiconductor integrated circuit device, just as they are, there is a possibility that the input part of the other circuit at the next stage of the semiconductor integrated circuit device fails to work properly, or an unnecessary DC current flows in the input part of the other circuit and hence the power consumption is increased. The interface circuit of the seventh embodiment is so constructed as to convert an output signal from any one of the circuits of the first to sixth embodiments into a signal having a level suitable for another circuit located at the next stage of the semiconductor integrated circuit device with stability in order to prevent a malfunction in the other circuit located at the next stage of the semiconductor integrated circuit device and an increase in the power consumption in the other circuit.

When a two-input NAND gate and a latch circuit located at the front of the interface circuit are activated, the input node 62 can receive an input signal from either the two-input NAND gate or the latch circuit, having either a HIGH logic level of 1.0 Volt or a LOW logic level of 0.0 Volts. A first inverter constructed of the p-channel MOSFET 63 and the n-channel MOSFET 69 then inverts the input signal from the sequential circuit and furnishes the inverted signal by way of the node 75. A second inverter constructed of the p-channel MOSFET 64 and the n-channel MOSFET 70 further inverts the inverted signal from the first inverter circuit and then furnishes a signal, which is the inversion of the inverted signal, having the same logic level as the input signal by way of the node 76. Accordingly, the inverted signal furnished via the node 75 and the signal, which is the inversion of the inverted signal, furnished via the node 76 are a complementary signal pair. They are then applied to the n-channel MOSFETs 71 and 72 of the first level converting circuit, respectively. Thus the level determining circuit furnishes a signal at a HIGH logic level by way of the node 76 and another signal at a LOW logic level by way of the node 75 when it has determined that an input signal has a HIGH logic level. On the other hand, the level determining circuit furnishes a signal at a LOW logic level by way of the node 76 and another signal at a HIGH logic level by way of the node 75 when it has determined that an input signal has a LOW logic level.

The p-channel MOSFETs 65 and 66 are connected between the third power supply 61 and the n-channel MOSFETs 71 and 72, respectively, and the gate of each of the p-channel MOSFETs 65 and 66 is connected to the drain of the other one of the p-channel MOSFETs in such a manner that the two connection lines cross each other. Signals at the nodes 77 and 78 can have either a LOW logic level of 0 Volts or a HIGH logic level of 3.3 Volts. When the node 75 has a HIGH logic level and the node 76 has a LOW logic level, the n-channel MOSFET 71 is brought into its on state and the n-channel MOSFET 72 is brought into its off state, and therefore the level of the node 77 descends to a LOW logic level. As a result, the p-channel MOSFET 66 is brought into its on state and the level of the node 78 rises to the potential of the third power supply 61 having a value of 3.3 Volts. Then the p-channel MOSFET 65 is brought into its off state and the level of the node 77 descends to the potential of the VB1 12 having a value of 0 Volts.

On the other hand, when the node 75 has a LOW logic level and the node 76 has a HIGH logic level, the level of the node 77 rises to the potential of the third power supply 61 having a value of 3.3 Volts and the level of the node 78 descends to the potential of the VB1 12 having a value of 0 Volts in a manner similar to the above case. Thus it can be assumed that the circuit comprised of the p-channel MOSFETs 65 and 66 and the n-channel MOSFETs 71 and 72 serves as a level converting circuit for converting an input signal having a LOW logic level into a signal having a level equal to the potential of the VB1 12, and for converting an input signal having a HIGH logic level into a signal having a level equal to the potential of the third power supply 61.

When the node 77 has a LOW logic level and the node 78 has a HIGH logic level, the p-channel MOSFET 67 is brought into its on state and the p-channel MOSFET 68 is brought into its off state, and therefore the level of the node 79 rises to a HIGH level having the same value as the potential of the third power supply 61. As a result, the n-channel MOSFET 74 is brought into its on state and the level of the node 80 descends to the potential of the GND 11 having a value of 0 Volts. Then the n-channel MOSFET 73 is brought into its off state and the level of the node 79 rises to the potential of the third power supply 61 having a value of 3.3 Volts. On the other hand, when the node 77 has a HIGH logic level and the node 78 has a LOW logic level, the level of the node 79 descends to the potential of the GND 11 having a value of 0 Volts and the level of the node 78 rises to the potential of the third power supply 61 having a value of 3.3 Volts in a manner similar to the above case. Thus it can be assumed that the circuit comprised of the p-channel MOSFETs 67 and 68 and the n-channel MOSFETs 73 and 74 serves as a level converting circuit for converting an input signal having a LOW logic level equal to the potential of the VB1 12 into a signal having a level equal to the potential of the GND 11, and for converting an input signal having a HIGH logic level equal to the potential of the power supply 61 into a signal having a level equal to the potential of the power supply 61. The converted signal is furnished as a first output signal OUT by way of the node 80. Furthermore, a second output signal OUT* which is a complementary signal of the output signal OUT is furnished by way of the node 79.

As previously explained, the interface circuit serves as a level converting circuit for converting an input signal having a LOW logic level equal to the potential of the VB1 12 into a signal having a level equal to the potential of the GND 11, and for converting an input signal having a HIGH logic level equal to the potential of the VA1 8 into a signal having a level equal to the potential of the third power supply 61, when a two-input NAND gate and a latch circuit located at the front of the interface circuit are activated. In other words, the first and second level converting circuits can convert an input signal at a HIGH logic level from a sequential circuit or the like into an output signal OUT having the same potential as the third power supply 61 and convert an input signal at a LOW logic level from the sequential circuit or the like into an output signal OUT having the same potential as the GND 11, in cooperation with each other, so as to match the potential of the output signal OUT to a desired potential which can be accepted by another circuit located at the back of the interface circuit. In addition, the interface circuit operates in such a manner that the potentials of the sources of MOSFETs held in an off state within the interface circuit becomes equal to those of their drains, respectively. Accordingly, an unnecessary DC current does not flow in the interface circuit and hence the power consumption in the interface circuit can be reduced.

When a two-input NAND gate and a latch circuit located at the front of the interface circuit are deactivated or brought into sleep, although the VA1 8 has a potential of 2.7 Volts and the VB1 12 has a potential of 0.6 Volts, as shown in FIG. 2, the interface circuit operates in the same manner as mentioned above with the exception that only the levels of the internal nodes are different from those when the two-input NAND gate and the latch circuit are activated. To be more specific, each of the nodes 62, 75, and 76 can have either a LOW logic level equal to the potential of the VB1 12 having a value of 0.6 Volts or a HIGH logic level equal to the potential of the VA1 8 having a value of 2.7 Volts. As a result, each of the nodes 77 and 78 can have either a LOW logic level equal to the potential of the VB1 12 having a value of 0.6 Volts or a HIGH logic level equal to the potential of the power supply 61 having a value of 3.3 Volts. Furthermore, each of the nodes 79 and 80 can have either a LOW logic level equal to the potential of the GND 11 having a value of 0 Volts or a HIGH logic level equal to the potential of the power supply 61 having a value of 3.3 Volts. Since all the substrates of the MOSFETs 63, 64, and 69 to 72 with threshold voltages having small absolute values are reverse-biased, the absolute values of the threshold voltages are increased and hence leakage currents flowing through the MOSFETs are reduced. In addition, since the absolute values of threshold voltages of the other MOSFETs are set be greater than those of the MOSFETs 63, 64, and 69 to 72, leakage currents flowing through the other MOSFETs are relatively low. Accordingly, when a two-input NAND gate and a latch circuit located at the front of the interface circuit are deactivated, the interface circuit serves as a level converting circuit for converting an input signal having a LOW logic level equal to the potential of the VB1 12 into a signal having a level equal to the potential of the GND 11, and for converting an input signal having a HIGH logic level equal to the potential of the VA1 8 into a signal having a level equal to the potential of the power supply 61, in a manner similar to the case where the two-input NAND gate and the latch circuit are activated. In addition, leakage currents flowing through the MOSFETs included in the interface circuit when the two-input NAND gate and the latch circuit are deactivated can be limited to small values.

As previously mentioned, the interface circuit according to the seventh embodiment of the present invention can convert an input signal having a LOW logic level into a signal having a level equal to the potential of the GND 11, and convert an input signal having a HIGH logic level into a signal having a level equal to the potential of the third power supply 61 having a value of 3.3 Volts, in both the case where a two-input NAND gate and a latch circuit are activated, and the case where the two-input NAND gate and the latch circuit are deactivated. Accordingly, the interface circuit of this embodiment makes it possible to match the potential of the output signal to a desired potential which can be accepted by another circuit located at the back of the interface circuit so as to make the other circuit receive the output signal and then operate with stability. In addition, since MOSFETs held in an off state within the interface circuit operate such that the potentials of the sources of the MOSFETs become equal to those of the gates of the MOSFETs, respectively, unnecessary DC currents do not flow in the interface circuit, and leakage currents flowing through the MOSFETs included in the interface circuit when a two-input NAND gate and a latch circuit located at the front of the interface circuit are deactivated can be reduced and hence the power consumption in the interface circuit can be reduced.

Eighth Embodiment

Figure 14:
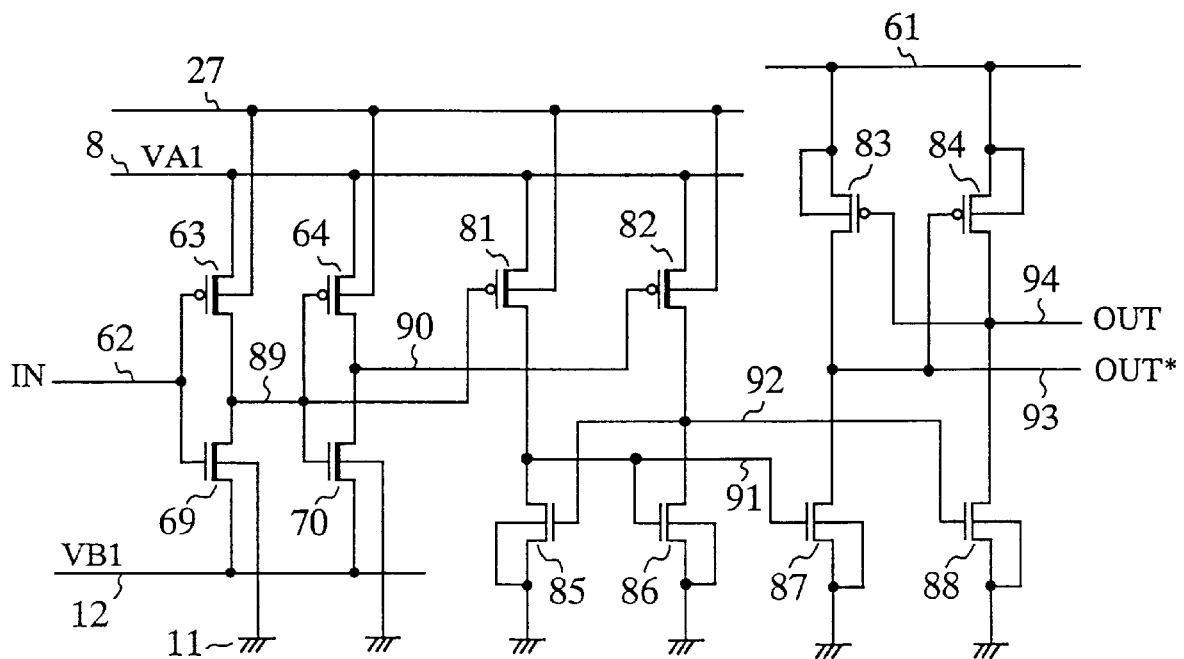
FIG. 14 is a schematic circuit diagram showing a semiconductor integrated circuit device according to an eighth embodiment of the present invention.
Figure 15:
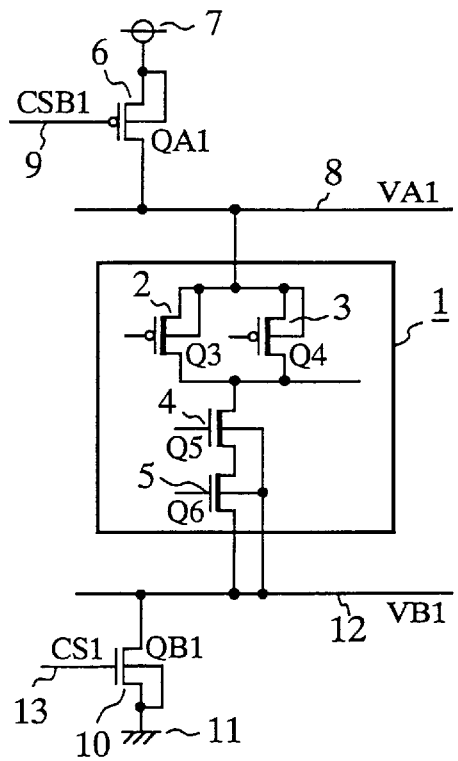
FIG. 15 is a schematic circuit diagram of a prior art semiconductor integrated circuit device which can run from low voltage supply.
Figure 16:
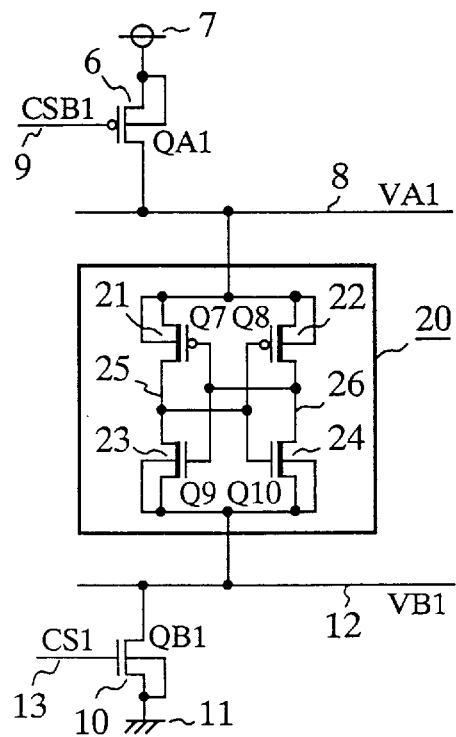
FIG. 16 is a schematic circuit diagram showing another prior art semiconductor integrated circuit device which implements a sequential circuit.

Referring next to FIG. 14, there is illustrated a schematic circuit diagram showing a semiconductor integrated circuit device according to an eighth embodiment of the present invention, which implements or serves as an interface circuit. In the figure, reference numerals 81 to 84 denote p-channel MOSFETs, and 85 to 88 denote n-channel MOSFETs. The absolute values of the threshold voltages of the p-channel MOSFETs 81 and 82 are set to be less than those of the p-channel MOSFETs 83 and 84. In addition, the absolute values of the threshold voltages of the n-channel MOSFETs 85 to 88 are set to be greater than those of the n-channel MOSFETs 69 and 70.

The p-channel MOSFET 81 and the n-channel MOSFET 85 are connected in series to each other between a first power supply line VA1 8 and a second power supply GND 11. The p-channel MOSFET 82 and the n-channel MOSFET 86 are also connected in series to each other between the VA1 8 and the GND 11. Each of the p-channel MOSFETs 81 and 82 has a substrate terminal connected to a first power supply 27, and each of the n-channel MOSFETs 85 and 86 has a substrate terminal connected to the GND 11. These p-channel and n-channel MOSFETs construct a first level converting circuit which, in response to signals at nodes 89 and 91, can generate a first signal having the same potential as the first power supply line VA1 8, and a second signal having the same potential as the GND 11.

The p-channel MOSFET 83 and the n-channel MOSFET 87 are connected in series to each other between a third power supply 61 and the GND 11. The p-channel MOSFET 84 and the n-channel MOSFET 88 are also connected in series to each other between the third power supply 61 and the GND 11. Each of the p-channel MOSFETs 83 and 84 has a substrate terminal connected to the third power supply 61, and each of the n-channel MOSFETs 87 and 88 has a substrate terminal connected to the GND 11. These p-channel and n-channel MOSFETs construct a second level converting circuit which, in response to signals at nodes 91 and 92, can generate an output signal having the same potential as the third power supply 61, and another output signal having the same potential as the GND 11. The other structure of the semiconductor integrated circuit device of this embodiment is the same as that of the semiconductor integrated circuit device of the seventh embodiment mentioned above, and therefore the description about the other structure will be omitted hereafter.

The interface circuit according to the eighth embodiment as shown in FIG. 14 thus comprises a first level converting circuit having the same structure as the second level converting circuit of the seventh embodiment, as shown in FIG. 13, located at the back of the first level converting circuit of the seventh embodiment, and a second level converting circuit having the same structure as the first level converting circuit of the seventh embodiment, as shown in FIG. 13, located at the front of the second level converting circuit of the seventh embodiment. In other words, the first level converting circuit of this embodiment located at the preceding stage can convert an input signal having a HIGH logic level into a signal having a value equal to the potential of the first power supply line VA1 8, and convert an input signal having a LOW logic level into a signal having a value equal to the potential of the second power supply GND 11. Then the second level converting circuit of this embodiment located at the next stage can convert an input signal having a HIGH logic level into a signal having a value equal to the potential of the third power supply 61, and convert an input signal having a LOW logic level into a signal having a value equal to the potential of the GND 11. Thus the first and second level converting circuits can convert an input signal at a HIGH logic level from a sequential circuit or the like into an output signal OUT having the same potential as the third power supply 61, and convert an input signal at a LOW logic level from the sequential circuit or the like into an output signal OUT having the same potential as the GND 11, in cooperation with each other, so as to match the potential of the output signal OUT to a desired potential which can be accepted by another circuit located at the back of the interface circuit.

As previously mentioned, the interface circuit according to the eighth embodiment can provide output signals similar to those provided by the interface circuit of the seventh embodiment. Accordingly, the interface circuit of this embodiment makes it possible to match the potential of the output signal OUT to a desired potential which can be accepted by another circuit located at the back of the interface circuit so as to make the other circuit receive the output signal OUT and then operate with stability. In addition, since MOSFETs held in an off state within the interface circuit operate such that the potentials of the sources of the MOSFETs become equal to those of the gates of the MOSFETs, respectively, unnecessary DC currents do not flow in the interface circuit, and leakage currents flowing through the MOSFETs when a two-input NAND gate and a latch circuit located at the front of the interface circuit are deactivated can be reduced and hence the power consumption in the interface circuit can be reduced, like the seventh embodiment.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor integrated circuit device comprising:
a first power supply node;
a second power supply node having a potential less than that of said first power supply node;
a first switching element capable of connecting said first power supply node with a first power supply line;
a second switching element capable of connecting said second power supply node with a second power supply line;
a first voltage drop circuit connected between said first power supply node and said first power supply line;
a second voltage drop circuit connected between said second power supply node and said second power supply line; and
a sequential circuit connected between said first power supply line and said second power supply line, and comprised of a plurality of p-channel MOSFETs and a plurality of n-channel MOSFETs, each of said plurality of p-channel MOSFETs having a substrate terminal connected to said first power supply node and each of said plurality of n-channel MOSFETs having a substrate terminal connected to said second power supply node,
wherein said first power supply node has a first potential when said first switching element is brought into conduction, and has a second potential having a value greater than that of the first potential when said first switching element is brought out of conduction.

2. The semiconductor integrated circuit device according to claim 1, further comprising a voltage converter for generating the first and second potentials of said first power supply from a power source.

3. The semiconductor integrated circuit device according to claim 1, wherein each of said first and second voltage drop circuits comprises one or more diodes connected in series.

4. The semiconductor integrated circuit device according to claim 1, wherein each of said first and second voltage drop circuits comprises one or more MOSFETs connected in series, each MOSFET having a gate and a drain connected to each other.

5. A semiconductor integrated circuit device comprising:
a first power supply node;
a second power supply node having a potential less than that of said first power supply node;
a first switching element capable of connecting said first power supply node with a first power supply line;
a second switching element capable of connecting said second power supply node with a second power supply line;
a first voltage drop circuit connected between said first power supply node and said first power supply line;
a second voltage drop circuit connected between said second power supply node and said second power supply line;
a sequential circuit connected between said first power supply line and said second power supply line, and comprised of a plurality of p-channel MOSFETs and a plurality of n-channel MOSFETs, each of said plurality of p-channel MOSFETs having a substrate terminal connected to said first power supply node and each of said plurality of n-channel MOSFETs having a substrate terminal connected to said second power supply node;

level determining means for determining whether an input signal from said sequential circuit has a HIGH logic level or a LOW logic level; and level converting means for converting the input signal into a signal having a predetermined high potential when said level determining means has determined that the input signal has a HIGH logic level, and for converting the input signal into a signal having a predetermined low potential when said level determining means has determined that the input signal has a LOW logic level.

6. The semiconductor integrated circuit device according to claim 5, further comprising a third power supply having a potential greater than that of said second power supply, wherein said level determining means includes a first inverter for inverting an input signal from said sequential circuit and for furnishing the inverted signal, and a second inverter for inverting the inverted signal from said first inverter and for furnishing a signal which is the inversion of the inverted signal, and wherein said level converting means includes a first level converting circuit for generating a first signal having the same potential as said third power supply and a second signal having the same potential as said second power supply line in response to the inverted signal from said first inverter and the signal from said second inverter which is the inversion of the inverted signal, and a second level converting circuit for generating a first output signal having the same potential as said third power supply and a second output signal having the same potential as said second power supply in response to the first and second signals from said first level converting circuit, so that said level converting means converts an input signal at a HIGH logic level from said sequential circuit into a signal having the same potential as said third power supply and converts an input signal at a LOW logic level from said sequential circuit into a signal having the same potential as said second power supply.

7. The semiconductor integrated circuit device according to claim 6, wherein each of said first and second inverters includes a pair of a p-channel MOSFET and an n-channel MOSFET connected in series to each other and connected between said first power supply line and said second power supply line, said p-channel MOSFET having a substrate terminal connected to said first power supply and said n-channel MOSFET having a substrate terminal connected to said second power supply, wherein said first level converting circuit includes two pairs of a p-channel MOSFET and an n-channel MOSFET connected in series to each other and connected between said third power supply and said second power supply line, the absolute values of threshold voltages of said p-channel MOSFETs of said first level converting circuit being greater than those of threshold voltages of the p-channel MOSFETs which construct said first and second inverters, each of said p-channel MOSFETs of said first level converting circuit having a substrate terminal connected to said third power supply and each of said n-channel MOSFETs of said first level converting circuit having a substrate terminal connected to said second power supply, and wherein said second level converting circuit includes two pairs of a p-channel MOSFET and an n-channel MOSFET connected in series to each other and connected between said third power supply and said second power supply, the absolute values of threshold voltages of said p-channel MOSFETs of said second level converting circuit being greater than those of threshold voltages of the p-channel MOSFETs which construct said first and second inverters, the absolute values of threshold voltages of said n-channel MOSFETs of said second level converting circuit being greater than those of threshold voltages of the n-channel MOSFETs which construct said first and second inverters, each of said p-channel MOSFETs of said second level converting circuit having a substrate terminal connected to said third power supply and each of said n-channel MOSFETs of said second level converting circuit having a substrate terminal connected to said second power supply.

8. The semiconductor integrated circuit device according to claim 5, further comprising a third power supply having a potential greater than that of said second power supply, wherein said level determining means includes a first inverter for inverting an input signal from said sequential circuit and for furnishing the inverted signal, and a second inverter for inverting the inverted signal from said first inverter and for furnishing a signal which is the inversion of the inverted signal, and wherein said level converting means includes a first level converting circuit for generating a first signal having the same potential as said first power supply and a second signal having the same potential as said second power supply in response to the inverted signal from said first inverter and the signal from said second inverter which is the inversion of the inverted signal, and a second level converting circuit for generating a first output signal having the same potential as said third power supply and a second output signal having the same potential as said second power supply in response to the first and second signals from said first level converting circuit, so that said level converting means converts an output signal at a HIGH logic level from said sequential circuit into a signal having the same potential as said third power supply and converts an output signal at a LOW logic level from said sequential circuit into a signal having the same potential as said second power supply.

9. The semiconductor integrated circuit device according to claim 8, wherein each of said first and second inverters includes a pair of a p-channel MOSFET and an n-channel MOSFET connected in series to each other and connected between said first power supply line and said second power supply line, said p-channel MOSFET having a substrate terminal connected to said first power supply and said n-channel MOSFET having a substrate terminal connected to said second power supply, wherein said first level converting circuit includes two pairs of a p-channel MOSFET and an n-channel MOSFET connected in series to each other and connected between said first power supply and said second power supply, the absolute values of threshold voltages of said n-channel MOSFETs of said first level converting circuit being greater than those of threshold voltages of the n-channel MOSFETs which construct said first and second inverters, each of said p-channel MOSFETs of said first level converting circuit having a substrate terminal connected to said first power supply and each of said n-channel MOSFETs of said first level converting circuit having a substrate terminal connected to said second power supply, and wherein said second level converting circuit includes two pairs of a p-channel MOSFET and an n-channel MOSFET connected in series to each other and connected between said third power supply and said second power supply, the absolute values of threshold voltages of said p-channel MOSFETs of said second level converting circuit being greater than those of threshold voltages of the p-channel MOSFETs which construct said first and second inverters, the absolute values of threshold voltages of said n-channel MOSFETs of said second level converting circuit being greater than those of threshold voltages of the n-channel MOSFETs which construct said first and second inverters, each of said p-channel MOSFETs of said second level converting circuit having a substrate terminal connected to said third power supply and each of said n-channel MOSFETs of said second level converting circuit having a substrate terminal connected to said second power supply.

10. The semiconductor integrated circuit device according to claim 5, wherein each of said first and second voltage drop circuits comprises one or more diodes connected in series.

11. The semiconductor integrated circuit device according to claim 5, wherein each of said first and second voltage drop circuits comprises one or more MOSFETs connected in series, each MOSFET having a gate and a drain connected to each other.

12. A semiconductor integrated circuit device comprising:
a first power supply;
a second power supply having a potential less than that of said first power supply;
a third power supply having a potential greater than that of said first power supply;
a first p-channel MOSFET capable of connecting said first power supply with a first power supply line;
a second p-channel MOSFET capable of connecting said first power supply with a first node;
a third p-channel MOSFET capable of connecting said first node with said third power supply;
a first n-channel MOSFET capable of connecting said second power supply with a second power supply line;
a first voltage drop circuit connected between said first node and said first power supply line;
a second voltage drop circuit connected between said second power supply and said second power supply line; and
a sequential circuit connected between said first power supply line and said second power supply line, and comprised of a plurality of p-channel MOSFETs and a plurality of n-channel MOSFETs, the absolute values of threshold voltages of said plurality of p-channel MOSFETs being less than those of threshold voltages of said first to third p-channel MOSFETs, the absolute values of threshold voltages of said plurality of n-channel MOSFETs being less than those of threshold voltages of said first n-channel MOSFET, each of said plurality of p-channel MOSFETs having a substrate terminal connected to said first node, and each of said plurality of n-channel MOSFETs having a substrate terminal connected to said second power supply.

13. The semiconductor integrated circuit device according to claim 12, wherein each of said first and second voltage drop circuits is comprised of one or more diodes connected in series to each other.

14. The semiconductor integrated circuit device according to claim 12, wherein each of said first and second voltage drop circuits is comprised of one or more MOSFETs connected in series to each other and each having a gate and a drain connected in common to each other.

15. The semiconductor integrated circuit device according to claim 12, further comprising a voltage converter for either generating said first power supply from said third power supply or generating said third power supply from said first power supply.

16. The semiconductor integrated circuit device according to claim 12, further comprising level determining means for determining whether an input signal from said sequential circuit has a HIGH logic level or a LOW logic level, and level converting means for converting the input signal into a signal having a predetermined high potential when said level determining circuit has determined that the input signal has a HIGH logic level, and for converting the input signal into a signal having a predetermined low potential when said level determining circuit has determined that the input signal has a LOW logic level.

17. The semiconductor integrated circuit device according to claim 16, further comprising a fourth power supply having a potential greater than that of said second power supply, wherein said level determining means includes a first inverter for inverting an input signal from said sequential circuit and for furnishing the inverted signal, and a second inverter for inverting the inverted signal from said first inverter and for furnishing a signal which is the inversion of the inverted signal, and wherein said level converting means includes a first level converting circuit for generating a first signal having the same potential as said fourth power supply and a second signal having the same potential as said second power supply line in response to the inverted signal from said first inverter and the signal from said second inverter which is the inversion of the inverted signal, and a second level converting circuit for generating a first output signal having the same potential as said fourth power supply and a second output signal having the same potential as said second power supply in response to the first and second signals from said first level converting circuit, so that said level converting means converts an output signal at a HIGH logic level from said sequential circuit into a signal having the same potential as said fourth power supply and converts an output signal at a LOW logic level from said sequential circuit into a signal having the same potential as said second power supply.

18. The semiconductor integrated circuit device according to claim 17, wherein each of said first and second inverters includes a pair of a p-channel MOSFET and an n-channel MOSFET connected in series to each other and connected between said first power supply line and said second power supply line, said p-channel MOSFET having a substrate terminal connected to said first power supply and said n-channel MOSFET having a substrate terminal connected to said second power supply, wherein said first level converting circuit includes two pairs of a p-channel MOSFET and an n-channel MOSFET connected in series to each other and connected between said fourth power supply and said second power supply line, the absolute values of threshold voltages of said p-channel MOSFETs of said first level converting circuit being greater than those of threshold voltages of the p-channel MOSFETs which construct said first and second inverters, each of said p-channel MOSFETs of said first level converting circuit having a substrate terminal connected to said fourth power supply and each of said n-channel MOSFETs of said first level converting circuit having a substrate terminal connected to said second power supply, and wherein said second level converting circuit includes two pairs of a p-channel MOSFET and an n-channel MOSFET connected in series to each other and connected between said fourth power supply and said second power supply, the absolute values of threshold voltages of said p-channel MOSFETs of said second level converting circuit being greater than those of threshold voltages of the p-channel MOSFETs which construct said first and second inverters, the absolute values of threshold voltages of said n-channel MOSFETs of said second level converting circuit being greater than those of threshold voltages of the n-channel MOSFETs which construct said first and second inverters, each of said p-channel MOSFETs of said second level converting circuit having a substrate terminal connected to said fourth power supply and each of said n-channel MOSFETs of said second level converting circuit having a substrate terminal connected to said second power supply.

19. The semiconductor integrated circuit device according to claim 16, further comprising a fourth power supply having a potential greater than that of said second power supply, wherein said level determining means includes a first inverter for inverting an input signal from said sequential circuit and for furnishing the inverted signal, and a second inverter for inverting the inverted signal from said first inverter and for furnishing a signal which is the inversion of the inverted signal, and wherein said level converting means includes a first level converting circuit for generating a first signal having the same potential as said first power supply and a second signal having the same potential as said second power supply in response to the inverted signal from said first inverter and the signal from said second inverter which is the inversion of the inverted signal, and a second level converting circuit for generating a first output signal having the same potential as said fourth power supply and a second output signal having the same potential as said second power supply in response to the first and second signals from said first level converting circuit, so that said level converting means converts an input signal at a HIGH logic level from said sequential circuit into a signal having the same potential as said fourth power supply and converts an input signal at a LOW logic level from said sequential circuit into a signal having the same potential as said second power supply.

20. The semiconductor integrated circuit device according to claim 19, wherein each of said first and second inverters includes a pair of a p-channel MOSFET and an n-channel MOSFET connected in series to each other and connected between said first power supply line and said second power supply line, said p-channel MOSFET having a substrate terminal connected to said first power supply and said n-channel MOSFET having a substrate terminal connected to said second power supply, wherein said first level converting circuit includes two pairs of a p-channel MOSFET and an n-channel MOSFET connected in series to each other and connected between said first power supply and said second power supply, the absolute values of threshold voltages of said n-channel MOSFETs of said first level converting circuit being greater than those of threshold voltages of the n-channel MOSFETs which construct said first and second inverters, each of said p-channel MOSFETs of said first level converting circuit having a substrate terminal connected to said first power supply and each of said n-channel MOSFETs of said first level converting circuit having a substrate terminal connected to said second power supply, and wherein said second level converting circuit includes two pairs of a p-channel MOSFET and an n-channel MOSFET connected in series to each other and connected between said fourth power supply and said second power supply, the absolute values of threshold voltages of said p-channel MOSFETs of said second level converting circuit being greater than those of threshold voltages of the p-channel MOSFETs which construct said first and second inverters, the absolute values of threshold voltages of said n-channel MOSFETs of said second level converting circuit being greater than those of threshold voltages of the n-channel MOSFETs which construct said first and second inverters, each of said p-channel MOSFETs of said second level converting circuit having a substrate terminal connected to said fourth power supply and each of said n-channel MOSFETs of said second level converting circuit having a substrate terminal connected to said second power supply.

* * * * *